(12) United States Patent
Yoon et al.

(10) Patent No.: US 11,784,051 B2
(45) Date of Patent: *Oct. 10, 2023

(54) SEMICONDUCTOR DEVICE AND METHOD FOR FABRICATING THE SAME

(71) Applicant: SK hynix Inc., Gyeonggi-do (KR)

(72) Inventors: Young-Gwang Yoon, Gyeonggi-do (KR); Yun-Ik Son, Gyeonggi-do (KR); Jee-Hyun Park, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 84 days.

This patent is subject to a terminal disclaimer.

(21) Appl. No.: 17/482,081

(22) Filed: Sep. 22, 2021

(65) Prior Publication Data
US 2022/0013363 A1    Jan. 13, 2022

Related U.S. Application Data

(63) Continuation of application No. 16/715,036, filed on Dec. 16, 2019, now Pat. No. 11,152,212.

(30) Foreign Application Priority Data

Mar. 8, 2019 (KR) .................. 10-2019-0026972

(51) Int. Cl.
| | |
|---|---|
| *H01L 29/49* | (2006.01) |
| *H01L 21/28* | (2006.01) |
| *H01L 21/3215* | (2006.01) |

(52) U.S. Cl.
CPC .. *H01L 21/28061* (2013.01); *H01L 21/32155* (2013.01); *H01L 29/4941* (2013.01)

(58) Field of Classification Search
None
See application file for complete search history.

(56) References Cited

U.S. PATENT DOCUMENTS

| | | | |
|---|---|---|---|
| 6,232,172 B1 | 5/2001 | Chen et al. | |
| 11,152,212 B2 * | 10/2021 | Yoon | ................ H01L 21/28035 |

OTHER PUBLICATIONS

Office Action for the Chinese Patent Application No. 201911265646.1 issued by the Chinese Patent Office dated Mar. 16, 2023.

* cited by examiner

*Primary Examiner* — Benjamin P Sandvik
(74) *Attorney, Agent, or Firm* — IP & T GROUP LLP

(57) ABSTRACT

A method for fabricating a semiconductor device may include: forming a gate dielectric material over a substrate; sequentially forming a carbon-undoped polysilicon layer and a carbon-doped polysilicon layer over the gate dielectric material; doping the carbon-doped polysilicon layer with a dopant; forming a columnar crystalline polysilicon layer over the carbon-doped polysilicon layer doped with the dopant; and performing annealing to activate the dopant.

7 Claims, 15 Drawing Sheets

SEMICONDUCTOR DEVICE AND METHOD FOR FABRICATING THE SAME

CROSS-REFERENCE TO RELATED APPLICATION

The present application is a Continuation of U.S. patent application Ser. No. 16/715,036 flied on Dec. 16, 2019, which claims priority under 35 USC § 119 to Korean Patent Application No. 10-2019-0026972 filed on Mar. 8, 2019, with the Korean Intellectual Property Office, and which is incorporated herein by reference in its entirety.

BACKGROUND

1. Field

Exemplary embodiments relate to a semiconductor device and, more particularly, to a semiconductor device including carbon-doped polysilicon and a method for fabricating the same.

2. Discussion of the Related Art

A gate stack of a semiconductor device may include a gate dielectric layer and a polysilicon layer. The polysilicon layer may be doped with a conductive dopant. In order to increase net doping in the polysilicon layer, the doping energy and doping dose of the dopant is increased.

However, the increased doping energy and doping dose may cause dopant penetration into the gate dielectric layer, which is detrimental to the characteristics of the gate stack. Increasing the dopant concentration without the dopant penetrating into the gate dielectric layer would be highly desirable because it could reduce gate resistance and improve gate controllability.

SUMMARY

Various embodiments of the present invention are directed to a semiconductor device having a structure which allows increasing the net doping in a layer thereof while reducing or preventing dopant penetration to a neighboring gate dielectric layer and a method for fabricating the same. The semiconductor device may exhibit improved gate controllability and reduced resistance. The dopant may be, for example, boron. The present invention is described via preferred embodiments employing one or more polysilicon layers, however, the invention is not limited in this way and could be implemented employing other suitable semiconductor material layers.

In an embodiment, a method for fabricating a semiconductor device may include: forming a gate dielectric material over a substrate; sequentially forming a carbon-undoped polysilicon layer and a carbon-doped polysilicon layer over the gate dielectric material; doping the carbon-doped polysilicon layer with a dopant; forming a columnar crystalline polysilicon layer over the carbon-doped polysilicon layer doped with the dopant; and performing annealing to activate the dopant.

In an embodiment, a method for fabricating a semiconductor device may include: forming a gate dielectric material over a substrate; sequentially forming a carbon-undoped polysilicon layer and a carbon-doped polysilicon layer over the gate dielectric material; forming an interface oxide material by oxidizing the surface of the carbon-doped polysilicon layer; doping the interface oxide material and the carbon-doped polysilicon layer with a dopant; forming a columnar crystalline polysilicon layer over the interface oxide material doped with the dopant; and performing annealing to activate the dopant.

In an embodiment, a semiconductor device may include: a gate dielectric layer over a substrate; and a gate electrode over the gate dielectric layer. The gate electrode may include: a carbon-undoped polysilicon layer over the gate dielectric layer; a carbon-doped polysilicon layer over the carbon-undoped polysilicon layer; a columnar crystalline polysilicon layer over the carbon-doped polysilicon layer; and a conductive interface oxide formed between the carbon-doped polysilicon layer and the columnar crystalline polysilicon layer.

These and other features and advantages of the present invention will become apparent to those skilled in the art of the invention from the following detailed description in conjunction with the following drawings.

DETAILED DESCRIPTION

Figure 1:
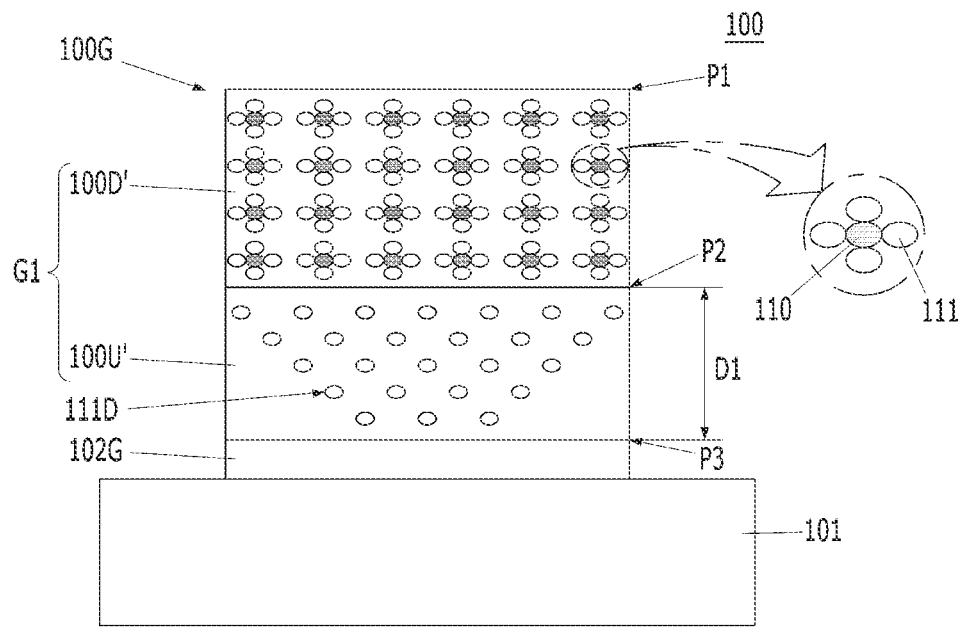
FIG. 1 is a cross-sectional view illustrating a structure of a semiconductor device in accordance with an embodiment of the present invention.

Hereinafter, various embodiments will be described with reference to the accompanying drawings to fully explain the present disclosure in such a manner that it may easily be carried out by a person with ordinary skill in the art to which the present disclosure pertains.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

In the following embodiments, a stack of a carbon-undoped polysilicon layer and a carbon-doped polysilicon layer may be applied on a gate dielectric layer to prevent dopant penetration into the gate dielectric layer from a polysilicon layer. As the carbon-doped polysilicon layer is applied, it is possible to sufficiently raise the doping concentration of a dopant, even though doping energy and doping dose are not increased.

FIG. 1 is a cross-sectional view illustrating a structure of a semiconductor device 100 in accordance with an embodiment of the present invention.

Referring to FIG. 1, the semiconductor device 100 may include a substrate 101 and a gate structure 100G formed over the substrate 101. The gate structure 100G may be formed on the substrate 101. The gate structure 100G may be a stack of a gate dielectric layer 102G and a gate electrode G1. The gate electrode G1 may include a stack of a carbon-undoped gate electrode 100U' and a carbon-doped gate electrode 100D'. The carbon-undoped gate electrode 100U' may be formed on the gate dielectric layer 102G. The carbon-undoped gate electrode 100U' may directly contact the gate dielectric layer 102G.

The substrate 101 may include a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multilayered structures thereof. The substrate 101 may include another semiconductor material such as germanium. The substrate 101 may include a III/V-group semiconductor substrate, for example, a compound semiconductor substrate such as GaAs. The substrate 101 may include a silicon-on-insulator (SOI) substrate.

The gate dielectric layer 102G may include silicon oxide, silicon oxynitride (SiON) or a combination thereof. In the present embodiment, the gate dielectric layer 102G may be silicon oxynitride (SiON). For example, in order to form silicon oxynitride (SiON), silicon oxide may be deposited and then nitrified. In another embodiment, the gate dielectric layer 102G may include a high-k material. In another embodiment, the gate dielectric layer 102G may include a stack of silicon oxide and a high-k material. In another embodiment, the gate dielectric layer 102G may include a stack of silicon oxynitride and a high-k material.

The carbon-doped gate electrode 100D' is doped with carbon 110. The carbon-undoped gate electrode 100U' is not doped with carbon 110. The carbon-doped gate electrode 100D' and the carbon-undoped gate electrode 100U' may be doped with dopants 111 and 111D, respectively. The dopants 111 and 111D may include an N-type dopant or P-type dopant. The dopants 111 and 111D may preferably include boron. The dopants 111 and 111D may include an implanted dopant 111 and a diffused dopant 111D. The implanted dopant 111 may indicate a dopant implanted by a doping process, and the diffused dopant 111D may indicate a part of the implanted dopant 111, which is diffused by annealing. Although will be described below, a dopant may be implanted into the carbon-doped gate electrode 100D', and diffused into the carbon-undoped gate electrode 100U' from the carbon-doped gate electrode 100D' by a subsequent annealing process. The carbon-doped gate electrode 100D' and the carbon-undoped gate electrode 100U' may be made of polysilicon. The carbon-doped gate electrode 100D' and the carbon-undoped gate electrode 100U' may include polysilicon having a random polycrystalline structure. Processes for making polysilicon having a random polycrystalline structure are well-known in the art and need not be described herein in any detail.

The carbon-undoped gate electrode 100U' may include the diffused dopant 111D. The carbon-doped gate electrode 100D' may include the carbon 110 and the implanted dopant 111. Since the implanted dopant 111 and the diffused dopant 111D contain boron, the carbon-undoped gate electrode 100L1 may be boron-doped polysilicon, and the carbon-doped gate electrode 100D' may be carbon and boron-doped polysilicon.

The carbon 110 of the carbon-doped gate electrode 100D' may serve to capture the implanted dopant 111. Therefore, the concentration of the implanted dopant 111 may be higher than that of the diffused dopant 111D.

The carbon-doped gate electrode 100D' and the carbon-undoped gate electrode 100U' may further include passivation species. Any suitable passivation species may be used. For example, the passivation species may include fluorine. The passivation species may passivate a dangling bond formed at an interface between the gate dielectric layer 102G and the substrate 101. Thus, the passivation species may improve the reliability of the gate dielectric layer 102G. The fluorine may be implanted with the implanted dopant 111, and captured by the carbon 110.

The carbon-doped gate electrode 100D' and the carbon-undoped gate electrode 100U' may have the same thickness or different thicknesses. For example, the carbon-doped gate electrode 100D' may have a larger thickness than the carbon-undoped gate electrode 100U'.

When each of the carbon-doped gate electrode 100D' and the carbon-undoped gate electrode 100U' includes polysilicon, the gate electrode G1 may have a double polysilicon structure.

Figure 2A:
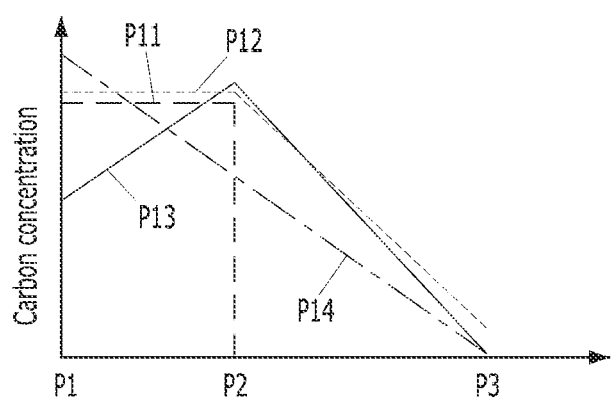
FIG. 2A is a graph for describing a carbon concentration profile in a gate electrode G1 of FIG. 1.

FIG. 2A is a graph for describing a carbon concentration profile in the gate electrode G1 of FIG. 1, and FIG. 23 is a graph for describing a boron concentration profile in the gate electrode G1 of FIG. 1.

Referring to FIG. 2A, a first position P1 corresponding to the top of the gate electrode G1, a second position P2 corresponding to the interface between the carbon-doped gate electrode 100D' and the carbon-undoped gate electrode 100U', and a third position P3 corresponding to the bottom of the gate electrode G1 may have different carbon concentrations. The concentration of the carbon 110 within the gate electrode G1 may have any one of first to fourth profiles P11 to P14.

The first profile P11 shows that the carbon-doped gate electrode 100D' is uniformly doped with a high concentration of carbon 110, and the carbon-undoped gate electrode 100U' is not doped with carbon.

The second profile P12 shows that the carbon-doped gate electrode 100D' is uniformly doped with a high concentration of carbon 110, and the carbon-undoped gate electrode 100U' has a carbon concentration that gradually decreases from the second position P2 toward the third position P3.

The third profile P13 shows that the carbon-doped gate electrode 100D' has a carbon concentration that gradually increases from the first position P1 toward the second position P2, and the carbon-undoped gate electrode 100U' has a carbon concentration that gradually decreases from the second position P2 toward the third position P3. Therefore, the carbon concentration may be the highest at the second position.

The fourth profile P14 shows that the carbon-doped gate electrode 100D' has a carbon concentration that gradually decreases from the first position P1 toward the second position P2, and the carbon-undoped gate electrode 100U' has a carbon concentration that gradually decreases from the second position P2 toward the third position P3. Therefore, the carbon concentration within the gate electrode G1 may have a linear profile in which the carbon concentration gradually decreases from the first position P1 toward the third position P3.

Preferably, the gate electrode G1 of FIG. 1 may have a carbon concentration profile corresponding to the first profile P11.

Figure 2B:
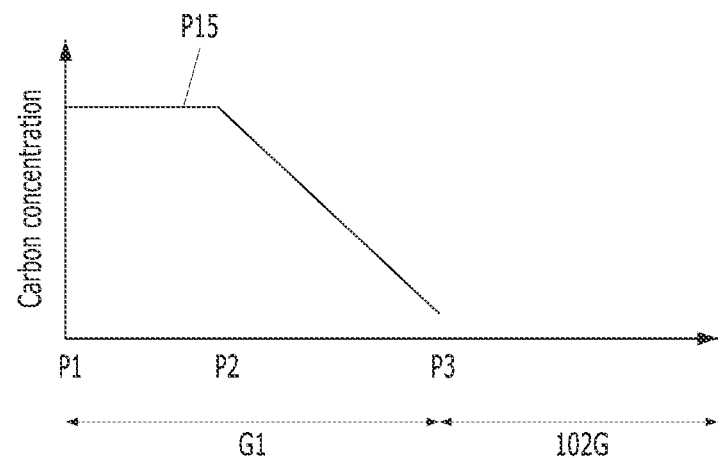
FIG. 2B is a graph for describing a boron concentration profile in the gate electrode G1 of FIG. 1.

Referring to FIG. 2B, a boron concentration profile P15 may be controlled in the gate electrode G1. The gate electrode G1 may be uniformly doped with a high concentration of boron at the first and second positions P1 and P2, and the boron concentration may gradually decrease from the second position P2 toward the third position P3. No boron may be diffused into the gate dielectric layer 102G. Thus, no boron is measured in any position (not shown) within the gate dielectric layer 102G.

Thus, the above-described semiconductor device 100 may prevent the diffused dopant 111D from penetrating into the gate dielectric layer 102G, and prevent damage to the gate dielectric layer 102G. Based on the embodiment illustrated in FIG. 1, the dopant concentration (e.g, boron) may be increased in the carbon-doped gate electrode 100D' while the gate dielectric layer 102G is kept free of any dopant. This can be accomplished by controlling the carbon doping of the carbon-doped gate electrode 100D' and the thickness D1 of the carbon-undoped gate electrode 100U'.

Figure 3A:
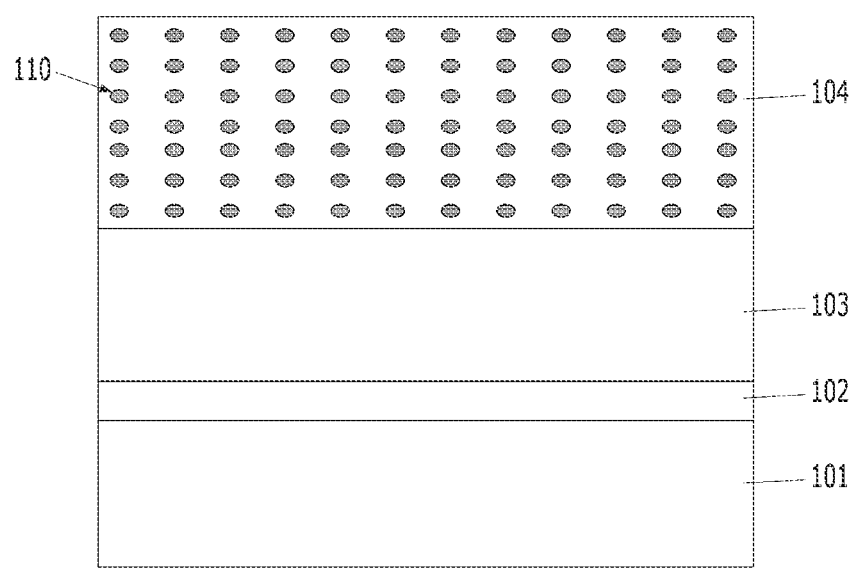
FIGS. 3A to 3C are cross-sectional views for describing an example of a method for fabricating the semiconductor device of FIG. 1.
Figure 3B:
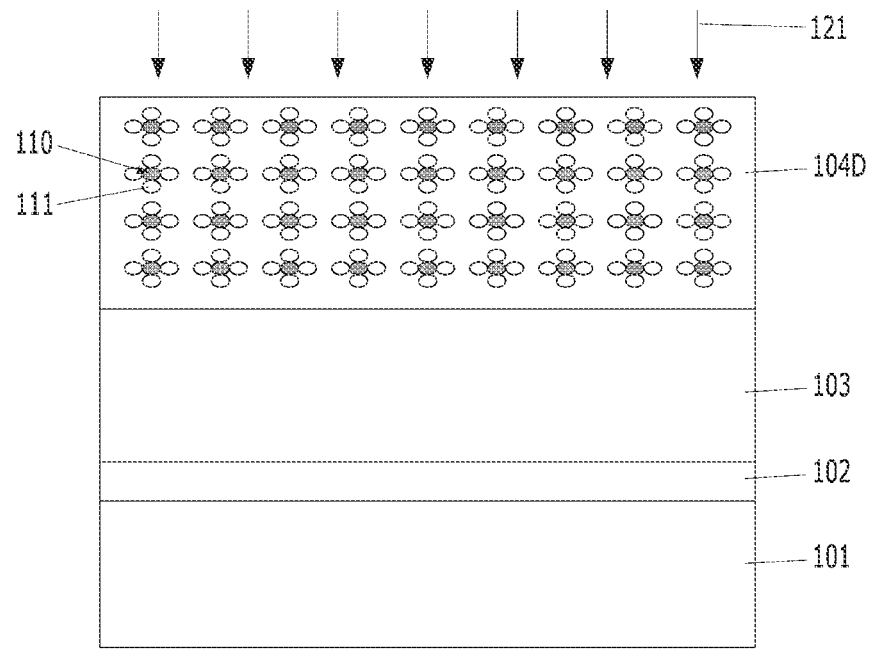
Figure 3C:
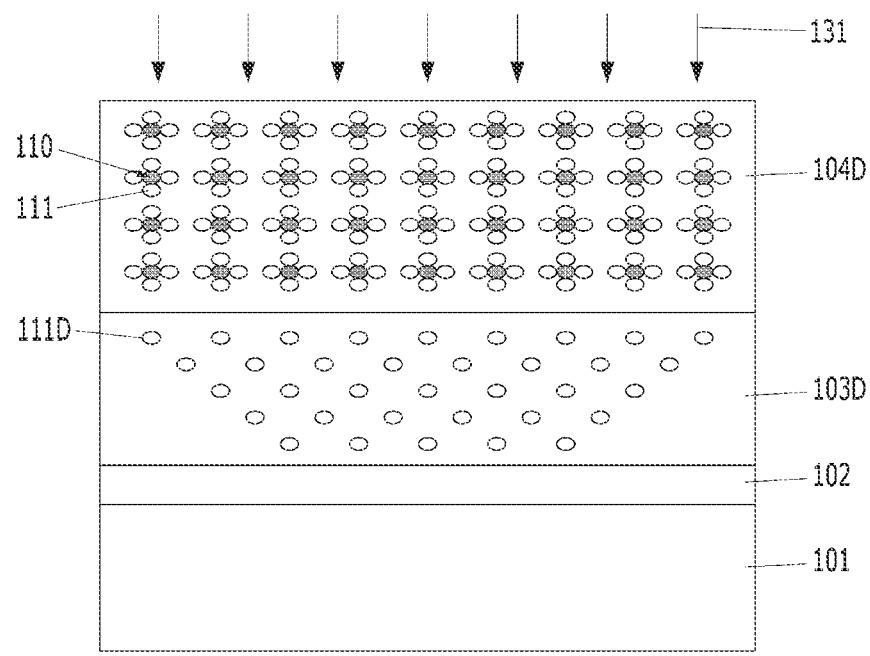

FIGS. 3A to 3C are cross-sectional views for describing an example of a method for fabricating the semiconductor device of FIG. 1.

As illustrated in FIG. 3A, a gate dielectric material 102 may be formed on a substrate 101.

The substrate 101 may include a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multilayered structures thereof. The substrate 101 may include another semiconductor material such as germanium. The substrate 101 may include a III/V-group semiconductor substrate, for example, a compound semiconductor substrate such as GaAs. The substrate 101 may include a silicon-on-insulator (SOI) substrate.

The gate dielectric material 102 may include silicon oxide, silicon oxynitride or a combination thereof. In the present embodiment, the gate dielectric material 102 may include silicon oxynitride (SiON). For example, in order to form silicon oxynitride (SiON), silicon oxide may be deposited and then nitrified.

A first silicon-containing material 103 may be formed on the gate dielectric material 102. The first silicon-containing material 103 may include polysilicon. The first silicon-containing material 103 may be in an undoped state where it is not doped with a conductive dopant. 'Undoped' may indicate that a conductive dopant is not contained. The first silicon-containing material 103 may not include capture species such as carbon. The first silicon-containing material 103 may include undoped polysilicon.

A second silicon-containing material 104 may be formed on the first silicon-containing material 103. The second silicon-containing material 104 may include polysilicon. The second silicon-containing material 104 may be in an undoped state where it is not doped with a conductive dopant. The second silicon-containing material 104 may include the carbon 110. The conductive dopant may be a material for imparting N-type or P-type conductivity, and the carbon 110 may be a material for capturing the conductive dopant. The carbon 110 which has no influence on the conductivity may be referred to as a non-conductive dopant. The carbon 110 may capture a conductive dopant implanted by subsequent doping processes and a diffused conductive dopant. The second silicon-containing material 104 may include undoped polysilicon, and the undoped polysilicon may be carbon containing-undoped polysilicon.

Hereafter, the first silicon-containing material 103 will be referred to as a carbon-undoped polysilicon layer 103, and the second silicon-containing material 104 will be referred to as a carbon-doped polysilicon layer 104. Preferably, the carbon-undoped polysilicon layer 130 and the carbon-doped polysilicon layer 104 may have a random polycrystalline structure.

The carbon-undoped polysilicon layer 103 and the carbon-doped polysilicon layer 104 may be formed in-situ. When the carbon-doped polysilicon layer 104 is formed, the carbon 110 may be doped in-situ for improving its uniformity throughout the carbon-doped polysilicon layer 104. When the content of the carbon is too high, the carbon 110 may suppress activation of the conductive dopant during a subsequent activation process. Therefore, the carbon 110 concentration in the carbon-doped polysilicon layer 104 should be controlled below a value which prevents activation of the dopant in a subsequent activation process. For this reason, when boron is dopant, it has been found that the carbon 110 concentration within the carbon-doped polysilicon layer 104 should be preferably $10^{10}$ atoms/cm$^3$ or less. The carbon 110 may be doped in-situ when the carbon-doped polysilicon layer 104 is deposited. For example, when the carbon-doped polysilicon layer 104 is deposited, a silicon source material and a carbon source material may be applied. Preferably, the carbon 110 may be uniformly distributed within the carbon-doped polysilicon layer 104. The concentration of the carbon 110 may be constant along the thickness of the carbon-doped polysilicon layer 104. Once the carbon-doped polysilicon layer 103 is formed, the supply of the carbon source material may be stopped in order to form the carbon-undoped layer 104. In another embodiment, the carbon-doped polysilicon layer 104 may be a carbon-graded doped polysilicon layer. For example, the carbon concentration in the carbon-doped polysilicon layer 104 may be graded by gradually changing a flow rate of the carbon source material during the in-situ forming process of the carbon-doped polysilicon layer 104. For example, the flow rate of the carbon source material could be increased or decreased in a gradual or step wise manner during the in-situ forming process of the carbon-doped polysilicon layer 104 to form the carbon-doped polysilicon layer 104 with a desired carbon concentration profile.

Preferably, the carbon-undoped polysilicon layer 103 and the carbon-doped polysilicon layer 104 may be deposited, for example, through chemical vapor deposition (CVD) or atomic layer deposition (ALD). The carbon-undoped polysilicon layer 103 may be deposited using a first silicon source material. The carbon-doped polysilicon layer 104 may be deposited using a second silicon source material and a carbon source material.

For example, when the carbon-undoped polysilicon layer 103 is deposited, monosilane (SiH$_4$) may be preferably used as the first silicon source material. The carbon-undoped polysilicon layer 103 may be referred to as a 'monosilane-based polysilicon layer'.

When the carbon-doped polysilicon layer 104 is deposited, preferably, monosilane (SiH$_4$) or disilane (Si$_2$H$_6$) may be used as the second silicon source material. A carbon-hydrogen compound, for example, C$_2$H$_4$ may be used as the carbon source material.

In the illustrated embodiment, the entire region of the carbon-doped polysilicon layer 104, the carbon 110 may have a uniform concentration, However, the invention is not limited in this way and in another embodiment, the carbon 110 may preferably have a concentration that gradually decreases or increases along the thickness of the carbon-doped polysilicon layer 104. For example, the carbon 110 may have the highest concentration at the interface between the carbon-doped polysilicon layer 104 and the carbon-undoped polysilicon layer 103, and the lowest concentration at the surface of the carbon-doped polysilicon layer 104. Furthermore, the carbon 110 may have the lowest concentration at the interface between the carbon-doped polysilicon layer 104 and the carbon-undoped polysilicon layer 103, and the highest concentration at the surface of the carbon-doped polysilicon layer 104. The carbon-doped polysilicon layer 104 in which the concentration of the carbon 110 gradually changes may be referred to as a carbon-graded doped polysilicon layer 104.

In another embodiment, the carbon 110 may have the highest concentration in the intermediate region of the carbon-doped polysilicon layer 104.

A preferred thickness for the carbon-doped polysilicon layer 104 may be 100 Å or more. Preferably, the carbon-undoped polysilicon layer 103 may have a smaller thickness than the carbon-doped polysilicon layer 104. More preferably, the carbon-doped polysilicon layer 104 may have a thickness of from 100 Å to 200 Å, and most preferably from 100 Å to 150 Å. The carbon-undoped polysilicon layer 103 may have the same thickness as the carbon-doped polysilicon layer 104. Preferably, the carbon-undoped polysilicon layer 103 may have a smaller thickness than the carbon-doped polysilicon layer 104. Preferably, the carbon-undoped polysilicon layer 103 may have at least a 25% smaller thickness than the carbon-doped polysilicon layer 104, more preferably at least a 50% smaller thickness than the carbon-doped polysilicon layer 104, and, most preferably, a 70% smaller thickness than the carbon-doped polysilicon layer 104. Reducing the thicknesses of the carbon-doped polysilicon layer 104 and the carbon-undoped polysilicon layer 103 is advantageous for reducing the overall size of the semiconductor device.

As illustrated in FIG. 3B, a doping process 121 may be performed on the carbon-doped polysilicon layer 104. The doping process 121 may be a doping process of dopant 111. The dopant 111 may include an N-type dopant or P-type dopant as a conductive dopant. For example, the dopant 111 may include a P-type dopant such as boron or an N-type dopant such as phosphorous (P) or arsenic (As). Hereafter, preferred embodiments of the invention are described which employ boron as the dopant 111. Therefore, the dopant 111 may also be referred to as 'boron 111' for convenience. However, the present invention may also be implemented with any other P-type or N-type dopant. For example, when phosphorous or arsenic are the conductive dopant, the dopant gas may be phosphine or arshine, respectively. Embodiments of the present invention allow increasing the conductive dopant concentration in one or more polysilicon layers while preventing undesirable diffusion of the conductive dopant into an underlying gate dielectric layer. Embodiments of the present invention may also prevent diffusion of the conductive dopant into neighboring layers of different conductivity type. Embodiments of the present invention are particularly useful in controlling the distribution of boron which is known to diffuse rapidly between semiconductor layers.

The doping process 121 of the boron 111 may use boron (B), $BF_2$ or $BF_3$ as a boron source material. The doping process 121 of the boron 111 may include ion beam implantation, plasma doping (PLAD) or a combination thereof. The doping process 121 of the boron 111 may preferably include boron (B) ion beam implantation, $BF_2$ ion beam implantation and/or $BF_3$ plasma doping. The doping process 121 of the boron 111 may preferably include boron (B) ion beam implantation and fluorine (F) ion beam implantation. Preferably, the boron (B) ion beam implantation and the fluorine (F) ion beam implantation may be performed sequentially. The carbon-doped polysilicon layer 104 may be doped, preferably, with fluorine by the fluorine (F) ion beam implantation, the $BF_2$ ion beam implantation and/or the $BF_3$ plasma doping. The fluorine serving as passivation species may passivate a dangling bond formed at an interface between the gate dielectric material 102 and the substrate 101 during a subsequent process. The fluorine passivation may improve the reliability of the gate dielectric material 102. The fluorine may be implanted into the carbon-doped polysilicon layer 104 with the boron 111. The fluorine may be captured by the carbon 110 of the carbon-doped polysilicon layer 104. Thus, out-diffusion of the fluorine may be prevented to improve passivation efficiency. The fluorine may also be implanted into the carbon-undoped polysilicon layer 103.

The carbon-doped polysilicon layer 104 doped with the boron 111 by the doping process 121 may become a boron and carbon-doped polysilicon layer 104D.

The boron and carbon-doped polysilicon layer 104D may be a doped polysilicon layer which is doped with both of boron and carbon. The boron 111 is captured by the carbon 110 and therefore its concentration in the boron and carbon-doped polysilicon layer 104D can increase substantially with only a small amount of boron diffusing into the carbon-undoped polysilicon layer 103.

Hence, during the doping process 121, the carbon-undoped polysilicon layer 103 may also be doped with a small amount of boron 111. However, most of the boron 111 may be captured by the carbon 110 and located in the boron and carbon-doped polysilicon layer 104D.

The doped boron 111 may be referred to as implanted boron.

As illustrated in FIG. 3C, annealing 131 may be performed, Dopant diffusion may be performed by the annealing 131. The annealing 131 may be referred to as activation annealing, and the dopant may be activated by the annealing 131. The dopant activation and diffusion may include activation and diffusion of the boron 111.

The dopant diffusion may indicate that the boron 111 is uniformly diffused in the boron and carbon-doped polysilicon layer 104D. Furthermore, the dopant diffusion may indicate that the boron 111 is diffused into the carbon-undoped polysilicon layer 130 from the boron and carbon-doped polysilicon layer 104D. Most of the boron 111 may be located in the boron and carbon-doped polysilicon layer 104D. Since the carbon 110 of the boron and carbon-doped polysilicon layer 104D captures most of the boron 111, the diffusion of the boron 111 into the carbon-undoped polysilicon layer 103 may be minimized.

While the annealing 131 is performed, the diffusion of the boron 111 may continuously occur. However, only a small amount of diffused boron 111B may be diffused from the boron and carbon-doped polysilicon layer 104D to form a boron-doped polysilicon layer 103D. The boron-doped polysilicon layer 103D may include the diffused boron 111D. The boron-doped polysilicon layer 103D may not be doped with carbon. The boron concentration of the boron-doped polysilicon layer 103D may be much lower than the boron concentration of the boron and carbon-doped polysilicon layer 103D.

While the annealing 131 is performed, the diffused boron 111D of the boron-doped polysilicon layer 103D may be diffused to the interface with the gate dielectric material 102, but not penetrate into the gate dielectric material 102.

Although the annealing 131 is performed as described above, most of the boron 111 and preferably substantially none of the boron 111 may not penetrate into the gate dielectric material 102 because most of the boron 111 is captured by the carbon 110. Therefore, a polysilicon depletion rate (PDR) may be improved.

While the annealing 131 is performed, out-diffusion of fluorine may be prevented by the carbon 110 of the boron and carbon-doped polysilicon layer 104D. The out-diffusion of fluorine may indicate the phenomenon that the fluorine is desorbed to the outside of the boron and carbon-doped polysilicon layer 104D. Since the fluorine is captured by the carbon 110, the out-diffusion may be suppressed. The fluorine may be out-diffused into the boron and carbon-doped polysilicon layer 104D from the boron-doped polysilicon layer 103D which is not doped with carbon, but the out-diffused fluorine may be captured by the carbon 110 of the boron and carbon-doped polysilicon layer 104D. The fluorine captured by the carbon 110 may be piled up in the boron and carbon-doped polysilicon layer 104D and the piled fluorine may improve the fluorine passivation efficiency during a subsequent process.

After the annealing 131, a stack of the boron-doped polysilicon layer 103D and the boron and carbon-doped polysilicon layer 104D may be formed over the gate dielectric material 102. The boron-doped polysilicon layer 103D may include the diffused boron 111D and the fluorine, and the boron and carbon-doped polysilicon layer 104D may include the carbon 110, the boron 111 and the fluorine.

Subsequently, the boron and carbon-doped polysilicon layer 104D, the boron-doped polysilicon layer 103D and the gate dielectric material 102 may be sequentially etched. Therefore, as illustrated in FIG. 1, the gate structure 100G may be formed.

The gate structure 100G may be a stack of the gate dielectric layer 102G and the gate electrode G1. The gate electrode G1 may have a stacked structure of the carbon-undoped gate electrode 100U' and the carbon-doped gate electrode 100D' on the carbon-undoped gate electrode 100U'. The carbon-doped gate electrode 100D' may contain the carbon 110, and the carbon-undoped gate electrode 100U' may not contain the carbon 110. The carbon-undoped gate electrode 100U' may include the diffused boron 111D, and the boron and carbon-doped gate electrode 100D' may include the boron 111. The carbon-undoped gate electrode 100U' and the carbon-doped gate electrode 100D' may include any suitable passivation species, including, preferably fluorine as passivation species. The carbon-undoped gate electrode 100U' may be formed by etching the boron-doped polysilicon layer 103D. The carbon-doped gate electrode 100D' may be formed by etching the boron and carbon-doped polysilicon layer 104D. The gate dielectric layer 102G may be formed by etching the gate dielectric material 102.

Figure 4:
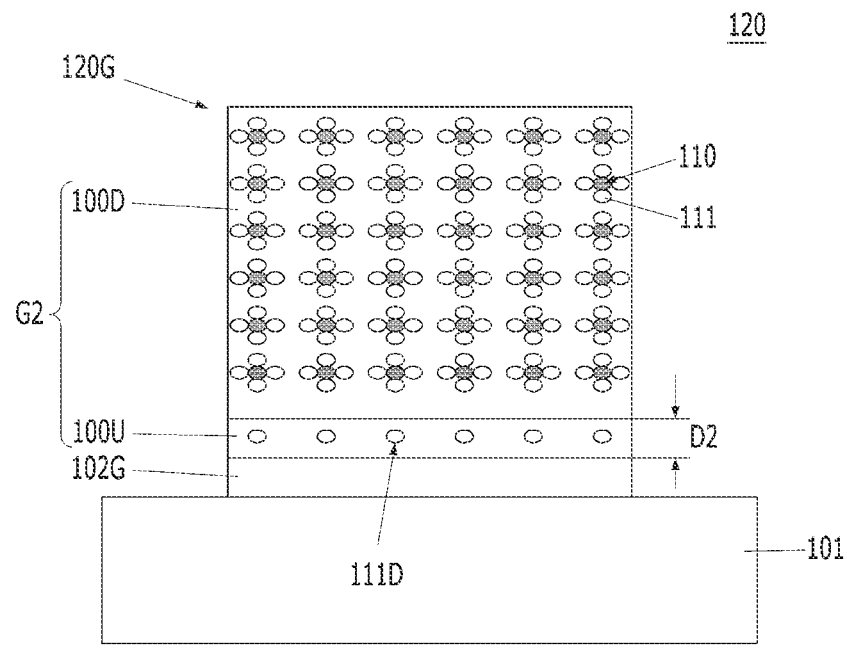
FIG. 4 is a cross-sectional view illustrating a semiconductor device in accordance with an embodiment of the present invention.

FIG. 4 is a cross-sectional view illustrating a semiconductor device in accordance with an embodiment of the present invention. A semiconductor device 120 of FIG. 4 may be similar to the semiconductor device 100 of FIG. 1.

Referring to FIG. 4, the semiconductor device 120 may include a substrate 101 and a gate structure 120G formed over or, preferably, on the substrate 101. The gate structure 120G may be a stack of a gate dielectric layer 102G and a gate electrode G2. The gate electrode G2 may include a stack of a carbon-undoped gate electrode 100U and a carbon-doped gate electrode 100D.

The carbon-doped gate electrode 100D may be doped with carbon 110, and the carbon-undoped gate electrode 100U may not be doped with the carbon 110. The carbon-doped gate electrode 100D and the carbon-undoped gate electrode 100U may be doped with dopants 111 and 111D, respectively. The dopants 111 and 111D may include an N-type dopant or P-type dopant. The dopants 111 and 111D may preferably include boron. The dopants 111 and 111D may include an implanted dopant 111 and a diffused dopant 111D. The implanted dopant 111 may indicate a dopant implanted by a doping process, and the diffused dopant 111D may indicate a part of the implanted dopant 111 diffused by annealing. As described below, the dopant may be implanted into the carbon-doped gate electrode 100D, and diffused into the carbon-undoped gate electrode 100U from the carbon-doped gate electrode 100D by a subsequent annealing process. The carbon-doped gate electrode 100D and the carbon-undoped gate electrode 100U may include polysilicon having a random crystalline structure.

The carbon-undoped gate electrode 100U may include the diffused dopant 111D. The carbon-doped gate electrode 100D may include the carbon 110 and the implanted dopant 111. Since the implanted dopant 111 and the diffused dopant 111D contain boron, the carbon-undoped gate electrode 100U may be boron-doped polysilicon, and the carbon-doped gate electrode 100D may be carbon and boron-doped polysilicon.

The carbon-doped gate electrode 100D and the carbon-undoped gate electrode 100U may further include passivation species. Any suitable passivation species may be used. For example, the passivation species may include fluorine. The passivation species may passivate a dangling bond formed at an interface between the gate dielectric layer 102G and the substrate 101. Thus, the reliability of the gate dielectric layer 102G may be improved. The fluorine may be implanted with the implanted dopant 111, and captured by the carbon 110.

The carbon 110 of the carbon-doped gate electrode 100D may capture the implanted dopant 111. Therefore, the concentration of the implanted dopant 111 may be higher than that of the diffused dopant 111D.

The carbon-undoped gate electrode 100U may be extremely thin. For example, the carbon-undoped gate electrode 100U may be thinner than the carbon-undoped gate electrode 100U' of FIG. 1 (D2<D1).

The carbon-undoped gate electrode 100U may be formed of a disilane-based polysilicon layer. The carbon-undoped gate electrode 100U' of FIG. 1 may be formed of a monosilane-based polysilicon layer. The disilane-based polysilicon layer may be formed thinner and more conformally than the monosilane-based polysilicon layer. For example, the disilane-based polysilicon layer may preferably deposited to a small thickness D2 of 30 Å or less. Therefore, the carbon-undoped gate electrode 100U may preferably have a small thickness D2 of 30 Å or less. The carbon-doped gate electrode 100D may preferably include a monosilane-based polysilicon layer or a disilane-based polysilicon layer.

The semiconductor device 120 of FIG. 4 may increase the thickness of the carbon-doped gate electrode 100D by decreasing the thickness of the carbon-undoped gate electrode 100U. Therefore, the thickness occupied by the carbon-doped gate electrode 100D can be maximized, and the thickness occupied by the carbon-undoped gate electrode 100U can be minimized.

When the thickness of the carbon-doped gate electrode 100D is increased, the carbon concentration of the carbon-doped gate electrode 100D can be freely adjusted. When the thickness of the carbon-undoped gate electrode 100U is decreased, the thickness of the gate electrode G2 can be effectively decreased. Furthermore, when the thickness of the carbon-doped gate electrode 100D is increased, not only vertical diffusion of the boron 111 but also lateral diffusion of the boron 111 can be prevented to suppress interdiffusion. The lateral diffusion may indicate interdiffusion between N-type polysilicon for an NMOSFET and P-type polysilicon for a PMOSFET, when dual polysilicon gates of a CMOSFET are formed.

Since the carbon-undoped gate electrode 100U is conformally formed with a small thickness, the thickness of the carbon-undoped gate electrode 100U can be decreased. Therefore, the thickness of the gate electrode G2 can be effectively decreased. Furthermore, the carbon-undoped gate electrode 100U may prevent an attack of the gate dielectric layer 102G.

Figure 5:
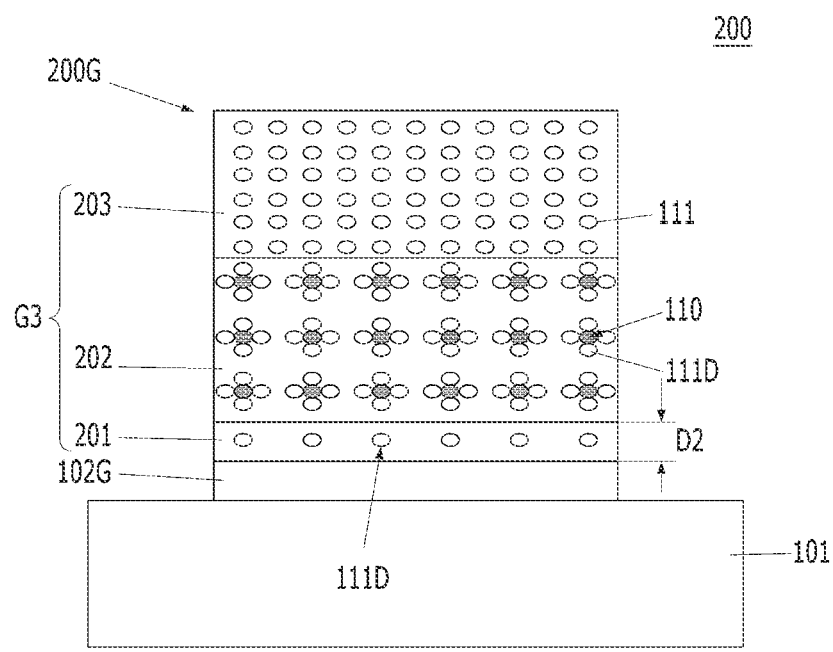
FIG. 5 is a cross-sectional view illustrating a semiconductor device in accordance with an embodiment of the present invention.

FIG. 5 is a cross-sectional view illustrating a semiconductor device in accordance with an embodiment of the present invention.

Referring to FIG. 5, a semiconductor device 200 may include a substrate 101 and a gate structure 200G formed over or, preferably, on the substrate 101. The gate structure 200G may be a stack of a gate dielectric layer 102G and a gate electrode G3. The gate electrode G3 may include a stack in which a carbon-undoped gate electrode 201, a carbon-doped gate electrode 202 and a columnar crystalline gate electrode 203 are sequentially stacked. The carbon-undoped gate electrode 201 may directly contact the gate dielectric layer 102G. The substrate 101 and the gate dielectric layer 102G may have the same structures as described with reference to FIG. 1.

The carbon-undoped gate electrode 201 and the carbon-doped gate electrode 202 may have a random crystalline structure, and the columnar crystalline gate electrode 203 may have a columnar crystalline structure. The columnar crystalline structure may have a directional crystalline structure. The columnar crystalline structure may facilitate dopant diffusion. The columnar crystalline structure may have a directional crystalline structure in which a dopant is diffused faster than in the random crystalline structure. The random crystalline structure may also be referred to as a 'non-columnar crystalline structure'.

The carbon-doped gate electrode 202 may be doped with carbon 110 while the carbon-undoped gate electrode 201 and the columnar crystalline gate electrode 203 may not be doped with the carbon 110. Each of the carbon-undoped gate electrode 201, the carbon-doped gate electrode 202 and the columnar crystalline gate electrode 203 may be doped with a dopant 111 or 111D. The dopants 111 and 111D may include an N-type dopant or P-type dopant. The dopants 111 and 111D may preferably include boron. The dopants 111 and 111D may include an implanted dopant 111 and a diffused dopant 111D. The implanted dopant 111 may indicate a dopant implanted by a doping process, and the diffused dopant 111D may indicate a part of implanted dopant 111, which is diffused by annealing. A dopant may be implanted into the columnar crystalline gate electrode 203, and diffused into the carbon-doped gate electrode 202 and the carbon-undoped gate electrode 201 from the columnar crystalline gate electrode 203 through a subsequent annealing process. The carbon-doped gate electrode 202 and the carbon-undoped gate electrode 201 may include a random polycrystalline polysilicon layer. The columnar crystalline gate electrode 203 may be a columnar crystalline polysilicon layer.

The carbon-doped gate electrode 202 and the carbon-undoped gate electrode 201 may include the diffused dopant 111D. The columnar crystalline gate electrode 203 may include the implanted dopant 111. The carbon-doped gate electrode 202 may include the carbon 110 and the diffused dopant 111D. Since the implanted dopant 111 and the diffused dopant 111D contain boron, the carbon-undoped gate electrode 201 and the columnar crystalline gate electrode 203 may be boron-doped polysilicon, and the carbon-doped gate electrode 202 may be carbon and boron-doped polysilicon.

The carbon-doped gate electrode 202, the carbon-undoped gate electrode 201 and the columnar crystalline gate electrode 203 may further include passivation species. Any suitable passivation species may be used. For example, the passivation species may include fluorine. The passivation species may passivate a dangling bond formed at an interface between the gate dielectric layer 102G and the substrate 101. Thus, the reliability of the gate dielectric layer 102G can be improved. The fluorine may be implanted with the implanted dopant 111, and captured by the carbon 110. The fluorine may be piled up in the carbon-doped gate electrode 202. The use of the carbon-doped gate electrode 202 has been found to improve the fluorine passivation efficiency.

The carbon 110 of the carbon-doped gate electrode 202 may capture the diffused dopant 111D. Therefore, the concentration of the diffused dopant 111D of the carbon-doped gate electrode 202 may be higher than that of the diffused dopant 111D of the carbon-undoped gate electrode 201.

The columnar crystalline gate electrode 203 and the carbon-doped gate electrode 202 may have the same thickness. The carbon-undoped gate electrode 201 may have a smaller thickness than the carbon-doped gate electrode 202. For example, the carbon-undoped gate electrode 201 may preferably have a thickness of 30 Å or less. The carbon-undoped gate electrode 201 may preferably include a disilane-based polysilicon layer. The columnar crystalline gate electrode 203 and the carbon-doped gate electrode 202 may preferably include a monosilane-based polysilicon layer or a disilane-based polysilicon layer.

In an embodiment, each of the columnar crystalline gate electrode 203, the carbon-doped gate electrode 202 and the carbon-undoped gate electrode 201 may include polysilicon, hence, the gate electrode G3 may have a triple polysilicon structure.

The implanted dopant 111 may be quickly diffused by the columnar crystalline boundary of the columnar crystalline gate electrode 203. The aforementioned structure enables the implanted dopant 111 to diffuse more quickly through the columnar crystalline boundary of the columnar crystalline gate electrode 203, and the concentration of the diffused dopant 111D of the carbon-doped gate electrode 202 may be maintained at a high concentration.

Since the carbon-doped gate electrode 202 and the carbon-undoped gate electrode 201 have a random polycrystalline structure, the carbon-doped gate electrode 202 and the carbon-undoped gate electrode 201 may suppress the diffused dopant 111D from diffusing to the gate dielectric layer 102G. Furthermore, since the carbon 110 of the carbon-doped gate electrode 202 captures the diffused dopant 111D, the carbon 110 may further suppress the diffused dopant 111D from diffusing to the gate dielectric layer 102G.

The polysilicon depletion rate PDR may be improved by the columnar crystalline gate electrode 203 and the carbon-doped gate electrode 202. Furthermore, although the concentration of the implanted dopant 111 is low, the polysilicon depletion rate PDR may be improved.

The stack of the carbon-doped gate electrode 202 and the columnar crystalline gate electrode 203 may also maximize the vertical profile of the implanted dopant 111, and further prevent lateral diffusion.

The stack of the carbon-undoped gate electrode 201, the carbon-doped gate electrode 202 and the columnar crystalline gate electrode 203 can increase the capture efficiency of the diffused dopant 111D, thereby improving the polysilicon depletion rate PDR.

The carbon-undoped gate electrode 201 may prevent a leakage current of the gate dielectric layer 102G.

Figure 6A:
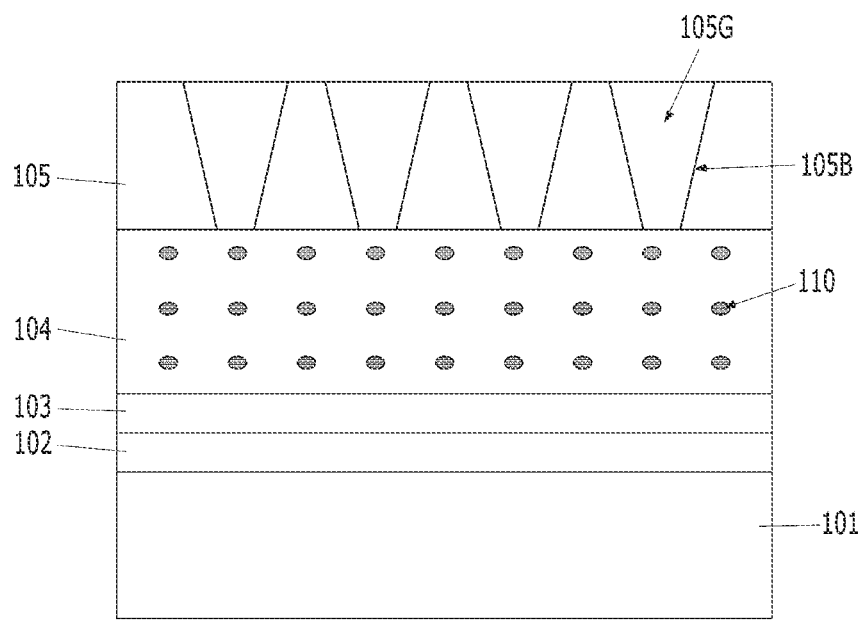
FIGS. 6A to 6C are cross-sectional views illustrating an example of a method for fabricating the semiconductor device of FIG. 5.
Figure 6B:
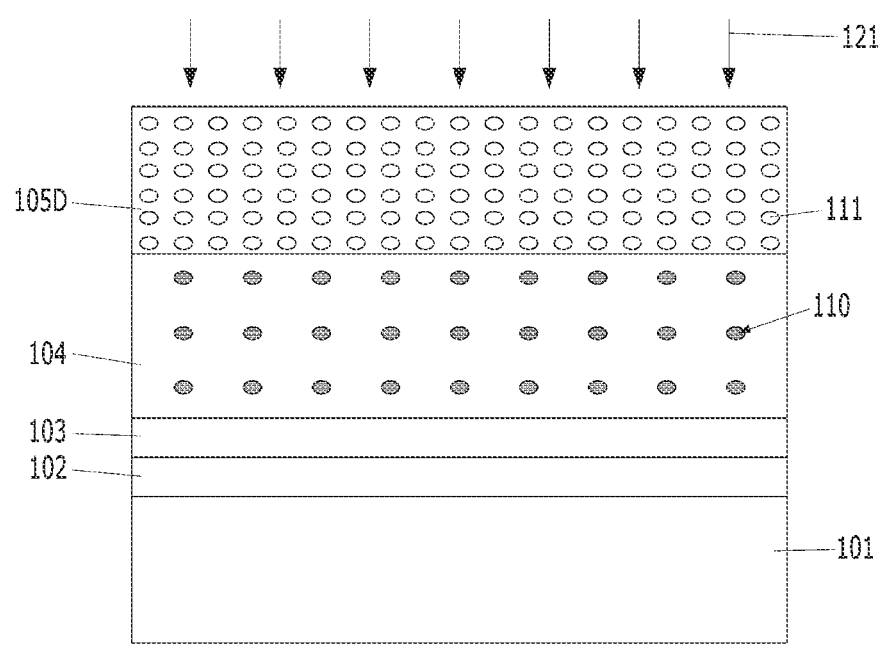
Figure 6C:
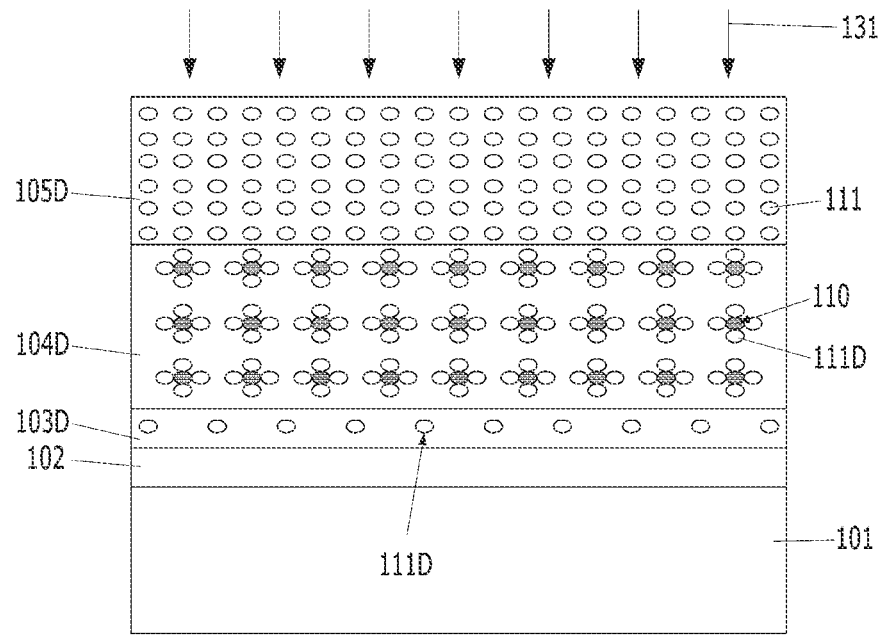

FIGS. 6A to 6C are cross-sectional views illustrating an example of a method for fabricating the semiconductor device of FIG. 5.

As illustrated in FIG. 6A, a gate dielectric material 102 may be formed over the substrate 101. The gate dielectric material 102 may be formed on the substrate 101. A carbon-undoped polysilicon layer 103 may be formed on the gate dielectric material 102. The carbon-undoped polysilicon layer 103 may be in an undoped state where it is not doped with a conductive dopant. The carbon-undoped polysilicon layer 103 may not include carbon. The carbon-undoped polysilicon layer 103 may be formed to be ultra-thin. The carbon-undoped polysilicon layer 103 may be formed of a disilane-based polysilicon layer. The disilane-based polysilicon layer may be formed thinner and more conformally than a monosilane-based polysilicon layer. The disilane-based polysilicon layer can be deposited to a small thickness, preferably of 30 Å or less. Therefore, the carbon-undoped polysilicon layer 103 may preferably have a small thickness, preferably of 30 Å or less.

Then, a carbon-doped polysilicon layer 104 may be formed on the carbon-undoped polysilicon layer 103.

The carbon-undoped polysilicon layer 103 and the carbon-doped polysilicon layer 104 may be formed in-situ. When the carbon-doped polysilicon layer 104 is formed, the carbon 110 may be doped in-situ. When the content of the carbon is too high, the carbon 110 may suppress activation of the conductive dopant during a subsequent activation process. Therefore, the carbon 110 concentration in the carbon-doped polysilicon layer 104 should be controlled below a value which prevents activation of the dopant in a subsequent activation process. For this reason, when boron is dopant, the carbon 110 concentration within the carbon-doped polysilicon layer 104 should be preferably $10^{10}$ atoms/cm$^3$ or less. The carbon 110 may be doped in-situ when the carbon-doped polysilicon layer 104 is deposited. For example, when the carbon-doped polysilicon layer 104 is deposited, a silicon source material and a carbon source material may be applied. The concentration of the carbon 110 may be constant along the thickness of the carbon-doped polysilicon layer 104. The carbon 110 may be uniformly distributed within the carbon-doped polysilicon layer 104. Once the carbon-doped polysilicon layer 103 is formed, the supply of the carbon source material may be stopped in order to form the carbon-undoped layer 104. In another embodiment, the carbon-doped polysilicon layer 104 may be a carbon-graded doped polysilicon layer. For example, the carbon concentration in the carbon-doped polysilicon layer 104 may be graded by gradually changing a flow rate of the carbon source material during the in-situ forming process of the carbon-doped polysilicon layer 104. For example, the carbon concentration could be increased or decreased in a gradual or step wise manner during the in-situ forming process of the carbon-doped polysilicon layer 104 to form the carbon-doped polysilicon layer 104 with a desired carbon concentration profile.

The carbon-undoped polysilicon layer 103 and the carbon-doped polysilicon layer 104 may be deposited, for example, through chemical vapor deposition (CVD) or atomic layer deposition (ALD), The carbon-undoped polysilicon layer 103 may be deposited using a first silicon source material. The carbon-doped polysilicon layer 104 may be deposited using a second silicon source material and a carbon source material.

When the carbon-undoped polysilicon layer 103 is deposited, preferably, disilane ($Si_2H_6$) may be used as the first silicon source material.

When the carbon-doped polysilicon layer 104 is deposited, preferably, monosilane ($SiH_4$) or disilane ($Si_2H_6$) may be used as the second silicon source material. A carbon hydrogen compound, for example, $C_2H_4$ may be used as the carbon source material.

A preferred thickness for the carbon-doped polysilicon layer 104 may be 100 Å or more. Preferably, the carbon-undoped polysilicon layer 103 may have a smaller thickness than the carbon-doped polysilicon layer 104. More preferably, the carbon-doped polysilicon layer 104 may have a thickness of from 100 Å to 200 Å, and most preferably from 100 Å to 150 Å. The carbon-undoped polysilicon layer 103 may have the same thickness as the carbon-doped polysilicon layer 104. Preferably, the carbon-undoped polysilicon layer 103 may have a smaller thickness than the carbon-doped polysilicon layer 104. Preferably, the carbon-undoped polysilicon layer 103 may have at least a 25% smaller thickness than the carbon-doped polysilicon layer 104, more preferably at least a 50% smaller thickness than the carbon-doped polysilicon layer 104, and, most preferably, a 70% smaller thickness than the carbon-doped polysilicon layer 104. Reducing the thicknesses of the carbon-doped polysilicon layer 104 and the carbon-undoped polysilicon layer 103 is advantageous for reducing the overall size of the semiconductor device. In an embodiment, the carbon-undoped polysilicon layer 103 may preferably have a thickness of 30 Å or less. Preferably, the carbon-doped polysilicon layer 104 may have a thickness of 100 Å or more. In order to increase the thickness of the carbon-doped polysilicon layer 104, monosilane ($SiH_4$) may be preferably used when the carbon-doped polysilicon layer 104 is deposited.

A columnar crystalline polysilicon layer 105 may be in-situ formed on the carbon-doped polysilicon layer 104. The columnar crystalline polysilicon layer 105 may include columnar grain structures 105G and a crystalline boundary 105B. Each of the columnar grain structures 105G may be, preferably, formed by a plurality of columnar crystals packed in the stacking direction.

Preferably, the columnar crystalline polysilicon layer 105 may have the same thickness as the carbon-doped polysilicon layer 104 and a larger thickness than the carbon-undoped polysilicon layer 103. The columnar crystalline polysilicon layer 105 may or may not be doped with carbon. Preferably, as illustrated in FIG. 6A, the columnar crystalline polysilicon layer 105 may not be doped with carbon. When the columnar crystalline polysilicon layer 105 is deposited, monosilane ($SiH_4$) or disilane ($Si_2H_6$) may be used as the silicon source material, The columnar crystalline polysilicon layer 105 may be formed at a higher temperature than the carbon-doped polysilicon layer 104 so as to have the columnar grain structures 105G and the crystalline boundary 105B.

As illustrated in FIG. 6B, a doping process 121 may be performed on the columnar crystalline polysilicon layer 105. The doping process 121 may be a doping process of an N-type or P-type dopant. The dopant 111 may include an N-type dopa it or P-type dopant as a conductive dopant. For example, the dopant 111 may include a P-type dopant such as boron, or an N-type dopant such as phosphorous (P) or arsenic (As). Preferably, the doping process 121 may include doping the columnar crystalline polysilicon layer 105 with boron 111. The doping process 121 of the boron 111 may use boron (B), $BF_2$, $BF_3$, or a combination thereof as a boron source material. The doping process 121 of the boron 111 may include ion beam implantation, plasma doping (PLAD) or a combination thereof. The doping process 121 of the boron 111 may be boron (B) ion beam implantation, $BF_2$ ion beam implantation or $BF_3$ plasma doping. The doping process 121 of the boron 111 may preferably include doping with a conductive dopant, for example boron (B) using a boron ion beam implantation and of a passivation species, for example fluorine (F) using fluorine ion beam implantation. For example, the conductive dopant implantation and the passivation species implantation may be performed sequentially.

The carbon-doped polysilicon layer 104 may be doped with fluorine as a passivation species using a fluorine (F) ion beam implantation, a $BF_2$ ion beam implantation and/or a $BF_3$ plasma doping. The fluorine may serve as passivation species to passivate a dangling bond formed at an interface between the gate dielectric material 102 and the substrate 101 during a subsequent process. The fluorine passivation may improve the reliability of the gate dielectric material 102. The fluorine may be implanted into the carbon-doped polysilicon layer 104 with the boron 111. The fluorine may be captured by the carbon 110 of the carbon-doped polysilicon layer 104. Thus, out-diffusion of the fluorine may be prevented to improve passivation efficiency. Other suitable passivation species may be used.

When the ion beam implantation is applied as the doping process 121 of the boron 111, a projected range Rp for the boron implantation may be defined based on the boundary between the columnar crystalline polysilicon layer 105 and the carbon-doped polysilicon layer 104. Projected range means the peak concentration depth of the boron dopant. Hence, the ion beam implantation 121 of the boron 111 may be designed to have a projected range Rp at the boundary between the columnar crystalline polysilicon layer 105 and the carbon-doped polysilicon layer 104.

The columnar crystalline polysilicon layer 105 doped with the boron 111 through the doping process 121 may become a boron-doped columnar crystalline polysilicon layer 105D.

In another embodiment, the doping processing 121 of the boron 111 may be performed after the carbon-doped polysilicon layer 104 is formed. The doping process 121 of the boron 111 may not be performed on the columnar crystalline polysilicon layer 105. For example, plasma doping may be applied as the doping process 121 of the boron 111 after the carbon-doped polysilicon layer 104 is formed.

As illustrated in FIG. 6C, annealing 131 may be performed, Dopant diffusion may be performed by the annealing 131. The annealing 131 may be referred to as activation annealing, and the dopant may be activated by the annealing 131. The dopant activation and diffusion may include activation and diffusion of the boron 111.

While the annealing 131 is performed, the boron 111 may be quickly diffused in the boron-doped columnar crystalline polysilicon layer 105J. The boron 111 may be quickly diffused along the crystalline boundary 105B of FIG. 6A. Furthermore, the boron 111 may be diffused into the carbon-doped polysilicon layer 104 from the boron-doped columnar crystalline polysilicon layer 105D. Most of the diffused boron 111D diffused from the boron-doped columnar crystalline polysilicon layer 105D may be located in the carbon-doped polysilicon layer 104. The carbon-doped polysilicon layer 104 doped with the diffused boron 111D may be referred to as 'boron and carbon-doped polysilicon layer 104D'. The diffused boron 111D may be captured by the carbon 110 and piled-up in the boron and carbon-doped polysilicon layer 104D. Since the carbon 110 of the boron and carbon-doped polysilicon layer 104D captures most of the diffused boron 111D, the diffusion of the diffused boron 111D into the carbon-undoped polysilicon layer 103 may be minimized.

While the annealing 131 is performed, the diffusion of the boron 111 may continuously occur. However, only a small amount of boron 111D may be diffused from the boron and carbon-doped polysilicon layer 104D. As the small amount of boron 111 is diffused, the carbon-undoped polysilicon layer 103 may become a boron-doped polysilicon layer 103D. The boron-doped polysilicon layer 103D may include the diffused boron 111D. The boron-doped polysilicon layer 103D may not be doped with carbon. The boron concentration of the boron-doped polysilicon layer 103D may be much lower than the boron concentration of the boron and carbon-doped polysilicon layer 104D.

While the annealing 131 is performed, the diffused boron 111D of the boron-doped polysilicon layer 103D may be diffused to the interface with the gate dielectric material 102, but not penetrate into the gate dielectric material 102.

Although the annealing 131 is performed as described above, most of the diffused boron and preferably substantially none of the diffused boron 111D may not penetrate into the gate dielectric material 102 because most of the diffused boron 111D is captured by the carbon 110. Therefore, a polysilicon depletion rate (PDR) can be improved.

While the annealing 131 is performed, out-diffusion of fluorine may be prevented by the carbon 110 of the boron and carbon-doped polysilicon layer 104D. The out-diffusion of the fluorine may indicate the phenomenon that the fluorine is desorbed to the outside of the boron and carbon-doped polysilicon layer 104D. Since the fluorine is captured by the carbon 110, the out-diffusion may be suppressed, The fluorine may be out-diffused into the boron and carbon-doped polysilicon layer 104D and the boron-doped columnar crystalline polysilicon layer 105D from the boron-doped polysilicon layer 103D which is not doped with carbon, but the out-diffused fluorine may be captured by the carbon 110 of the boron and carbon-doped polysilicon layer 104D. The fluorine captured by the carbon 110 may be piled up in the boron and carbon-doped polysilicon layer 104D, and the piled fluorine may improve fluorine passivation efficiency in a subsequent process.

After the annealing 131, a stack of the boron-doped polysilicon layer 103D, the boron and carbon-doped polysilicon layer 104D and the boron-doped columnar crystalline polysilicon layer 105D may be formed on the gate dielectric material 102. The boron-doped polysilicon layer 103D may be doped with the diffused boron 111D, and the boron and carbon-doped polysilicon layer 104D may be doped with the carbon 110 and the diffused boron 111D. The boron-doped columnar crystalline polysilicon layer 105D may be doped with the boron 111.

Subsequently, the boron-doped columnar crystalline polysilicon layer 105D, the boron and carbon-doped polysilicon layer 104D, the boron-doped polysilicon layer 103D and the gate dielectric material 102 may be sequentially etched. Therefore, as illustrated in FIG. 5, the gate structure 200G may be formed.

The gate structure 200G may be a stack of the gate dielectric layer 102G and the gate electrode G3. The gate electrode G3 may have a stacked structure of the carbon-undoped gate electrode 201, the carbon-doped gate electrode 202 and the columnar crystalline gate electrode 203. The carbon-doped gate electrode 202 may contain the carbon 110, and the carbon-undoped gate electrode 201 and the columnar crystalline gate electrode 203 may not contain the carbon 110. The carbon-undoped gate electrode 201 may include the diffused boron 111D, and the boron and carbon-doped gate electrode 202 may include the diffused boron 111D. The columnar crystalline gate electrode 203 may include the boron 111. The carbon-undoped gate electrode 201, the carbon-doped gate electrode 202 and the columnar crystalline gate electrode 203 may include any suitable passivation species, including, preferably fluorine as passivation species. The carbon-undoped gate electrode 201 may be formed by etching the boron-doped polysilicon layer 103D. The carbon-doped gate electrode 202 may be formed by etching the boron and carbon-doped polysilicon layer 104D. The columnar crystalline gate electrode 203 may be formed by etching the boron-doped columnar crystalline polysilicon layer 105D. The gate dielectric layer 102G may be formed by etching the gate dielectric material 102.

Figure 7:
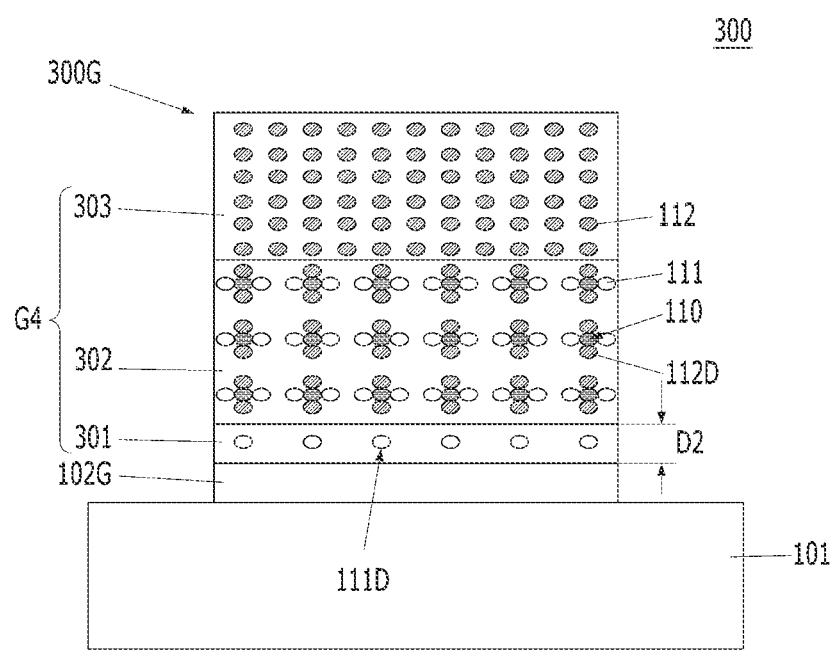
FIG. 7 is a cross-sectional view illustrating a semiconductor device in accordance with an embodiment of the present invention.

FIG. 7 is a cross-sectional view illustrating a semiconductor device in accordance with an embodiment of the present invention.

Referring to FIG. 7, a semiconductor device 300 may include a substrate 101 and a gate structure 300G formed over or, preferably, on the substrate 101. The gate structure 300G may be a stack of a gate dielectric layer 102G and a gate electrode G4. The gate electrode G4 may include a stack of a carbon-undoped gate electrode 301, a carbon-doped gate electrode 302 and a columnar crystalline gate electrode 303. The carbon-undoped gate electrode 301 may directly contact the gate dielectric layer 102G. The substrate 101 and the gate dielectric layer 102G may have the same structures as described with reference to FIG. 1.

The carbon-doped gate electrode 302 may be doped with carbon 110, and the carbon-undoped gate electrode 301 and the columnar crystalline gate electrode 303 may not be doped with the carbon 110. The carbon-undoped gate electrode 301, the carbon-doped gate electrode 302 and the columnar crystalline gate electrode 303 may be doped with dopants 111D, 111, 112D and 112, respectively. The dopants 111D, 111, 112D and 112 may include an N-type dopant or P-type dopant. The dopants 111D, 111, 112D and 112 may preferably include boron. The dopants 111D, 111, 112D and 112 may include implanted dopants 111 and 112 and diffused dopants 111D and 112D. The implanted dopants 111 and 112 may indicate dopants implanted by a doping process, and the diffused dopants 111D and 112D may indicate parts of the implanted dopants 111 and 112, which are diffused by annealing. The carbon-doped gate electrode 302 may be doped with the implanted dopant 111, the columnar crystalline gate electrode 303 may be doped with the implanted dopant 112, and the implanted dopants 111 and 112 may be diffused by a subsequent annealing process. The columnar crystalline gate electrode 303, the carbon-doped gate electrode 302 and the carbon-undoped gate electrode 301 may include polysilicon, The carbon-undoped gate electrode 301 and the carbon-doped gate electrode 302 may include a random polycrystalline polysilicon layer. The columnar crystalline gate electrode 303 may include a columnar crystalline polysilicon layer.

The carbon-doped gate electrode 302 may include the diffused dopant 112D, and the carbon-undoped gate electrode 301 may include the diffused dopant 111D. The carbon-doped gate electrode 302 may include the implanted dopant 111, and the columnar crystalline gate electrode 303 may include the implanted dopant 112. The carbon-doped gate electrode 302 may include the carbon 110, the implanted dopant 111 and the diffused dopant 112D. Since the implanted dopants 111 and 112 and the diffused dopants 111D and 112D include boron, the carbon-undoped gate electrode 301 and the columnar crystalline gate electrode 303 may be boron-doped polysilicon, and the carbon-doped gate electrode 302 may be carbon and boron-doped polysilicon.

In another embodiment, the columnar crystalline gate electrode 303 may not include the implanted dopant 112. In this case, the carbon-doped gate electrode 302 may not include the diffused dopant 112D. Therefore, the gate electrode G4 may include the implanted dopant 111 and the diffused dopant 111D, and not include the implanted dopant 112 and the diffused dopant 1124.

In another embodiment, the carbon-doped gate electrode 302 may not include the implanted dopant 111. In this case, the carbon-undoped gate electrode 301 may not include the diffused dopant 111D. Therefore, the gate electrode G4 may include the implanted dopant 112 and the diffused dopant 112D, and not include the implanted dopant 111 and the diffused dopant 111D.

The carbon-doped gate electrode 302 and the carbon-undoped gate electrode 301 may further include passivation species. The passivation species may be any suitable passivation species and, preferably, may include fluorine (F). The passivation species may passivate a dangling bond formed at an interface between the gate dielectric layer 102G and the substrate 101. Thus, the reliability of the gate dielectric layer 102G can be improved. The fluorine may be implanted with the implanted dopants 111 and 112, and captured by the carbon 110.

The carbon 110 of the carbon-doped gate electrode 302 may capture the diffused dopant 112D and the implanted dopant 111.

The columnar crystalline gate electrode 303 and the carbon-doped gate electrode 302 may have the same thickness. The carbon-undoped gate electrode 301 may have a smaller thickness than the carbon-doped gate electrode 302. For example, the carbon-undoped gate electrode 301 may preferably have a thickness of 30 Å or less.

When each of the columnar crystalline gate electrode 303, the carbon-doped gate electrode 302 and the carbon-undoped gate electrode 301 includes polysilicon, the gate electrode G4 may have a triple polysilicon structure.

The implanted dopant 112 may be quickly and easily diffused by columnar grains of the columnar crystalline gate electrode 303. Since the carbon-doped gate electrode 302 captures the diffused dopant 112D and the implanted dopant 111, the polysilicon depletion rate PDR may be improved. Since the columnar crystalline gate electrode 303 and the carbon-doped gate electrode 302 are formed, the polysilicon depletion rate PDR can be improved only by implanted dopants 111 and 112 having a low concentration.

The stack of the carbon-doped gate electrode 302 and the columnar crystalline gate electrode 303 may also maximize the vertical profile of the implanted dopants 111 and 112, and further prevent lateral diffusion.

The stack of the carbon-undoped gate electrode 301, the carbon-doped gate electrode 302 and the columnar crystalline gate electrode 303 can increase the capture efficiency of the implanted dopant 111 and the diffused dopant 112D, thereby improving the polysilicon depletion rate PDR.

The carbon-undoped gate electrode 301 can prevent a leakage current of the gate dielectric layer 102G.

FIGS. 8A to 8E are cross-sectional views illustrating an example of a method for fabricating the semiconductor device of FIG. 7.

Figure 8A:
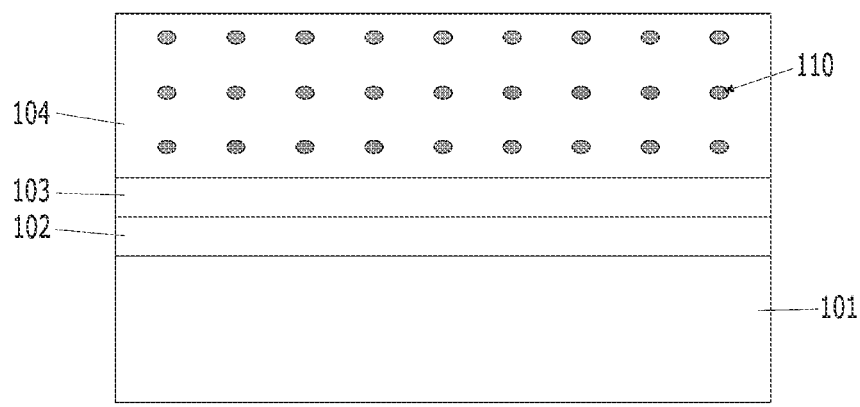
FIGS. 8A to 8E are cross-sectional views illustrating an example of a method for fabricating the semiconductor device of FIG. 7.

As illustrated in FIG. 8A, a gate dielectric material 102 may be formed over the substrate 101. The gate dielectric material 102 may be formed on the substrate 101. A carbon-undoped polysilicon layer 103 may be formed on the gate dielectric material 102. The carbon-undoped polysilicon layer 103 may be in an undoped state where it is not doped with a conductive dopant. The carbon-undoped polysilicon layer 103 may not include carbon. The carbon-undoped polysilicon layer 103 may be formed to be ultra-thin. The carbon-undoped polysilicon layer 103 may be formed of a disilane-based polysilicon layer. The disilane-based polysilicon layer may be formed thinner and more conformally than the monosilane-based polysilicon layer, The disilane-based polysilicon layer can be deposited to a small thickness, preferably of 30 Å or less. Therefore, the carbon-undoped polysilicon layer 103 may preferably have a small thickness, preferably of 30 Å or less.

Then, a carbon-doped polysilicon layer 104 may be formed on the carbon-undoped polysilicon layer 103.

The carbon-undoped polysilicon layer 103 and the carbon-doped polysilicon layer 104 may be formed in-situ. When the carbon-doped polysilicon layer 104 is formed, the carbon 110 may be doped in-situ. When the content of the carbon is too high, the carbon 110 may suppress activation of the conductive dopant during a subsequent activation process. Therefore, the carbon 110 concentration in the carbon-doped polysilicon layer 104 should be controlled below a value which prevents activation of the dopant in a subsequent activation process. For this reason, when boron is dopant, it has been found that the carbon 110 concentration within the carbon-doped polysilicon layer 104 should be preferably $10^{10}$ atoms/cm$^3$ or less. The carbon 110 may be doped in-situ when the carbon-doped polysilicon layer 104 is deposited. For example, when the carbon-doped polysilicon layer 104 is deposited, a silicon source material and a carbon source material may be applied. The carbon 110 may be uniformly distributed within the carbon-doped polysilicon layer 104. The concentration of the carbon 110 may be constant along the thickness of the carbon-doped polysilicon layer 104. Once, the carbon-doped polysilicon layer 103 is formed, the supply of the carbon source material may be stopped in order to form the carbon-undoped layer 104. In another embodiment, the carbon-doped polysilicon layer 104 may be a carbon-graded doped polysilicon layer, For example, the carbon concentration in the carbon-doped polysilicon layer 104 may be graded by gradually changing a flow rate of the carbon source material during the in-situ forming process of the carbon-doped polysilicon layer 104. For example, the carbon concentration could be increased or decreased in a gradual or step wise manner during the in-situ forming process of the carbon-doped polysilicon layer 104 to form the carbon-doped polysilicon layer 104 with a desired carbon concentration profile.

The carbon-undoped polysilicon layer 103 and the carbon-doped polysilicon layer 104 may be deposited, for example, through chemical vapor deposition (CVD) or atomic layer deposition (ALD). The carbon-undoped polysilicon layer 103 may be deposited using a first silicon source material. The carbon-doped polysilicon layer 104 may be deposited using a second silicon source material and a carbon source material.

When the carbon-undoped polysilicon layer 103 is deposited, preferably, disilane ($Si_2H_6$) may be used as the first silicon source material.

When the carbon-doped polysilicon layer 104 is deposited, preferably, monosilane ($SiH_4$) or disilane ($Si_2H_5$) may be used as the second silicon source material. A carbon hydrogen compound, for example, $C_2H_4$ may be used as the carbon source material.

A preferred thickness for the carbon-doped polysilicon layer 104 may be 100 Å or more. Preferably, the carbon-undoped polysilicon layer 103 may have a smaller thickness than the carbon-doped polysilicon layer 104. More preferably, the carbon-doped polysilicon layer 104 may have a thickness of from 100 Å to 200 Å, and most preferably from 100 Å to 150 Å. The carbon-undoped polysilicon layer 103 may have the same thickness as the carbon-doped polysilicon layer 104. Preferably, the carbon-undoped polysilicon layer 103 may have a smaller thickness than the carbon-doped polysilicon layer 104. Preferably, the carbon-undoped polysilicon layer 103 may have at least a 25% smaller thickness than the carbon-doped polysilicon layer 104, more preferably at least a 50% smaller thickness than the carbon-doped polysilicon layer 104, and, most preferably, a 70% smaller thickness than the carbon-doped polysilicon layer 104. Reducing the thicknesses of the carbon-doped polysilicon layer 104 and the carbon-undoped polysilicon layer 103 is advantageous for reducing the overall size of the semiconductor device. In an embodiment, the carbon-undoped polysilicon layer 103 may preferably have a thickness of 30 Å or less while the carbon-doped polysilicon layer 104 may preferably have a thickness of 100 Å or more. In order to increase the thickness of the carbon-doped polysilicon layer 104, monosilane ($SiH_4$) may be preferably used when the carbon-doped polysilicon layer 104 is deposited.

Figure 8B:
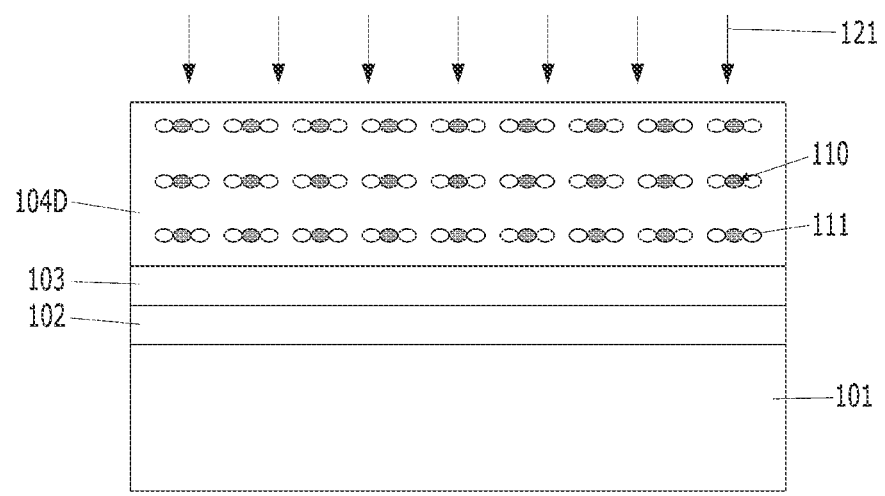

As illustrated in FIG. 8B, a first doping process 121 may be performed on the carbon-doped polysilicon layer 104. The first doping process 121 may be a doping process of an N-type or P-type dopant. For example, the first doping process 121 may include doping the carbon-doped polysilicon layer 104 with first boron 111. The first doping process 121 of the first boron 111 may use B, $BF_2$ or $BF_3$ as a boron source. The first doping process 121 of the first boron 111 may include ion beam implantation, plasma doping (PLAD) or a combination thereof. In addition to the first boron 111, another P-type dopant or N-type dopant may be implanted.

The first doping process 121 of the first boron 111 may use B ion beam implantation, $BF_2$ ion beam implantation and/or $BF_3$ plasma doping. The first doping process 121 of the first boron 111 may preferably include boron (B) ion beam implantation and fluorine (F) ion beam implantation which may be performed sequentially. The carbon-doped polysilicon layer 104 may be doped, preferably, with fluorine by the fluorine (F) ion beam implantation, the $BF_2$ ion beam implantation and/or the $BF_3$ plasma doping. The fluorine serving as passivation species may passivate a dangling bond formed at an interface between the gate dielectric material 102 and the substrate 101 in a subsequent process. The fluorine passivation can improve the reliability of the gate dielectric material 102. The fluorine may be implanted into the carbon-doped polysilicon layer 104 with the first boron 111. The fluorine may be captured by the carbon 110 of the carbon-doped polysilicon layer 104. Thus, out-diffusion of the fluorine may be prevented to improve passivation efficiency. The carbon-undoped polysilicon layer 103 may be doped with the fluorine.

A boron and carbon-doped polysilicon layer 104D may be formed by the first doping process 121, and the boron and carbon-doped polysilicon layer 104D may indicate the carbon-doped polysilicon layer 104 doped with the first boron 111.

The boron and carbon-doped polysilicon layer 104D may be a doped polysilicon layer which is doped with both of boron and carbon. The first boron 111 may be captured by the carbon 110 and piled-up in the boron and carbon-doped polysilicon layer 104D.

When the first doping process 121 is performed, the carbon-undoped polysilicon layer 103 may also be doped with a small amount of first boron 111. However, most of the first boron 111 may be captured by the carbon 110 and located in the boron and carbon-doped polysilicon layer 104D.

Since the first doping process 121 of the first boron 111 is performed before a subsequent columnar crystalline polysilicon layer 105 is deposited, the boron concentration of the boron and carbon-doped polysilicon layer 104D may be increased. Furthermore, the amount of first boron 111 captured in the boron and carbon-doped polysilicon layer 104D may be increased.

Figure 8C:
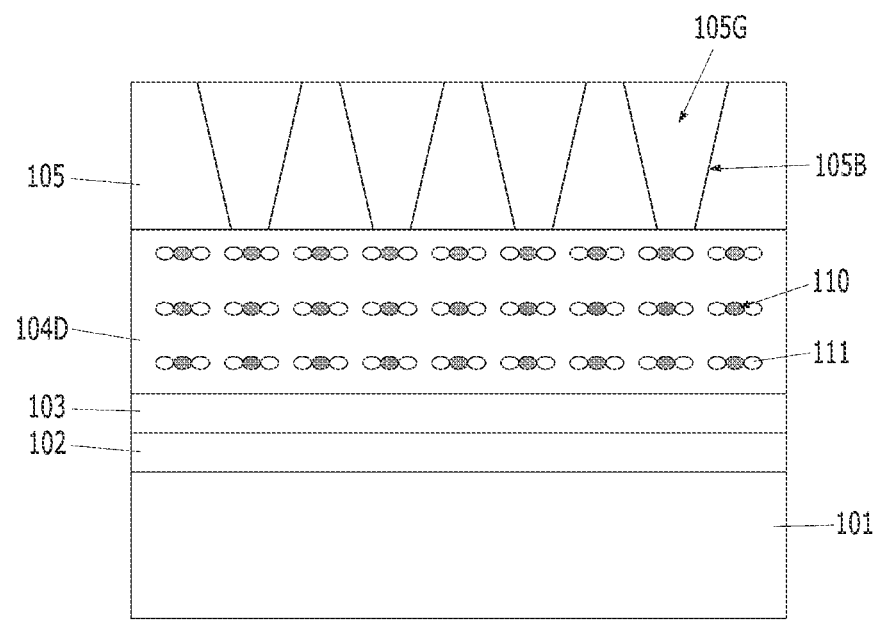

As illustrated in FIG. 8C, the columnar crystalline polysilicon layer 105 may be formed on the boron and carbon-doped polysilicon layer 104D. The columnar crystalline polysilicon layer 105 may include columnar grain structures 105G and a crystalline boundary 105B. The columnar crystalline polysilicon layer 105 may have the same thickness as the boron and carbon-doped polysilicon layer 104D and a larger thickness than the carbon-undoped polysilicon layer 103. The columnar crystalline polysilicon layer 105 may be a carbon-undoped columnar crystalline polysilicon layer.

Figure 8D:
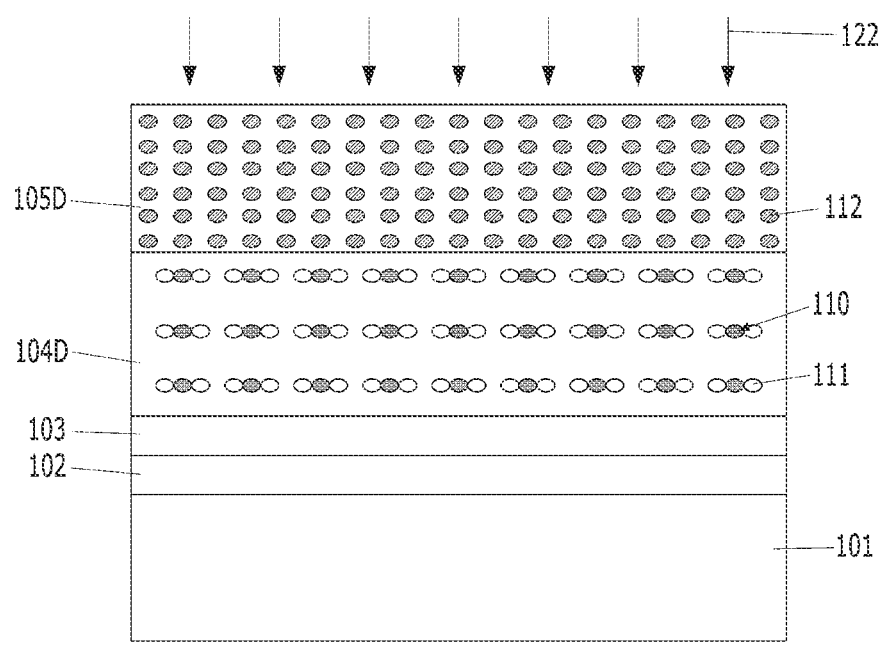

As illustrated in FIG. 8D, a second doping process 122 may be performed on the columnar crystalline polysilicon layer 105. The second doping process 122 may be a doping process of another dopant. The another dopant may be the same material as the dopant of the first doping process 121. The second doping process 122 may be a doping process of an N-type dopant or P-type dopant. For example, the second doping process 122 may include doping the columnar crystalline polysilicon layer 105 with second boron 112. The second doping process 122 of the second boron 112 may use B, $BF_2$ or $BF_3$ as a boron source. The second doping process 122 of the second boron 112 may include ion beam implantation, plasma doping (PLAD) or a combination thereof.

The second doping process 122 of the second boron 112 may preferably include boron (B) ion beam implantation, $BF_2$ ion beam implantation and/or $BF_3$ plasma doping. The second doping process 122 of the second boron 112 may preferably include boron (B) ion beam implantation and fluorine (F) ion beam implantation which may be performed sequentially. Preferably, the columnar crystalline polysilicon layer 105 may be doped with fluorine by fluorine (F) ion beam implantation, $BF_2$ ion beam implantation and/and/or plasma doping. The fluorine serving as passivation species may passivate a dangling bond formed at an interface between the gate dielectric material 102 and the substrate 101 in a subsequent process. The fluorine passivation can improve the reliability of the gate dielectric material 102. The fluorine may be implanted into the columnar crystalline polysilicon layer 105 with the second boron 112. A part of the fluorine may be captured by the carbon 110 of the carbon-doped polysilicon layer 104.

A boron-doped columnar crystalline polysilicon layer 105D may be formed by the second doping process 122. The boron-doped columnar crystalline polysilicon layer 105D may indicate the columnar crystalline polysilicon layer 105 doped with the second boron 112.

In another embodiment, plasma doping may be applied as the first doping process 121 of the first boron 111, and ion beam implantation may be applied as the second doping process 122 of the second boron 112. When the ion beam implantation is applied as the second doping process 122, a projected range Rp may be defined based on the boundary between the columnar crystalline polysilicon layer 105 and the boron and carbon-doped polysilicon layer 104D.

Figure 8E:
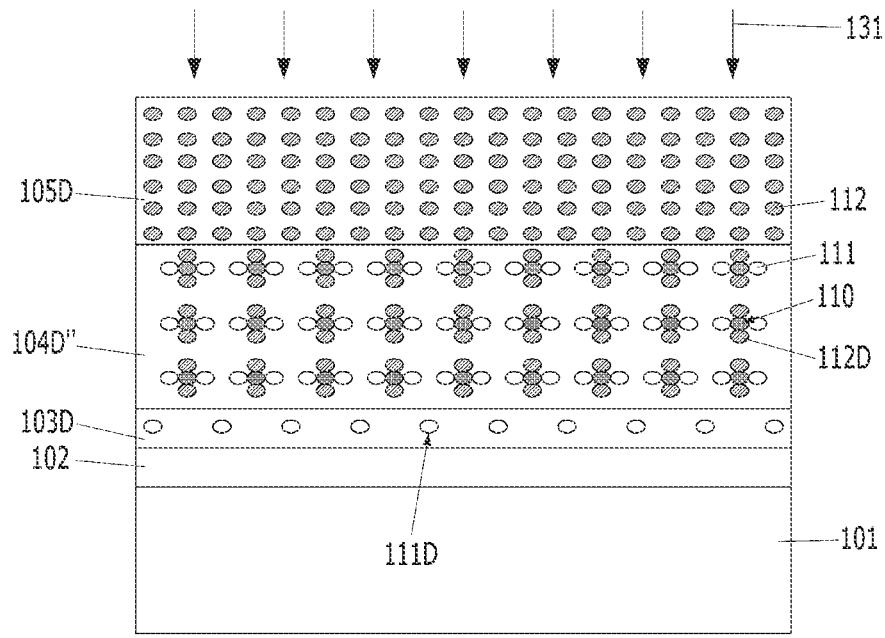

As illustrated in FIG. 8E, annealing 131 may be performed. Dopant diffusion may be performed by the annealing 131. The annealing 131 may be referred to as activation annealing, and the dopants may be activated by the annealing 131. The dopant activation and diffusion may include activation and diffusion of the second boron 112 and the first boron 111.

While the annealing 131 is performed, the boron 112 may be quickly diffused in the boron-doped columnar crystalline polysilicon layer 105D. The second boron 112 may be quickly diffused along the crystalline boundary 105B of FIG. 8C. Furthermore, the second boron 112 may be diffused into the boron and carbon-doped polysilicon layer 104D from the boron-doped columnar crystalline polysilicon layer 105D. Most of the diffused second boron 112D diffused from the boron-doped columnar crystalline polysilicon layer 105D may be located in the boron and carbon-doped polysilicon layer 104D. The boron and carbon-doped polysilicon layer 104D" doped with the diffused second boron 112D may include the diffused second boron 112D and the first boron 111. The diffused second boron 112D and the first boron 111 may be captured by the carbon 110 and piled-up in the boron and carbon-doped polysilicon layer 104D". Since the carbon 110 of the boron and carbon-doped polysilicon layer 104D" captures most of the diffused second boron 112D and the first boron 111, the diffusion of the diffused second boron 112D and the first boron 111 into the carbon-undoped polysilicon layer 103 may be minimized.

While the annealing 131 is performed, diffusion of the second boron 112 and the first boron 111 may continuously occur. However, only a small amount of diffused first boron 111D may be diffused from the boron and carbon-doped polysilicon layer 104D". As the small amount of first boron 111 is diffused, the carbon-undoped polysilicon layer 103 may become a boron-doped polysilicon layer 103D. The boron-doped polysilicon layer 103D may include the diffused first boron 111D. The boron-doped polysilicon layer 103D may not be doped with carbon. The boron concentration of the boron-doped polysilicon layer 103D may be much lower than the boron concentration of the boron and carbon-doped polysilicon layer 104D.

While the annealing 131 is performed, the diffused first boron 111D of the boron-doped polysilicon layer 103D may be diffused to the interface with the gate dielectric material 102, but not penetrate into the gate dielectric material 102.

Although the annealing 131 is performed as described above, most of the first boron 111 and the diffused second boron 112D may not penetrate into the gate dielectric material 102 because most of the first boron 111 and the diffused second boron 112D are captured by the carbon 110. Therefore, a polysilicon depletion rate (PDR) can be improved.

While the annealing 131 is performed, out-diffusion of fluorine may be prevented by the carbon 110 of the boron and carbon-doped polysilicon layer 104D". Since the fluorine is captured by the carbon 110, out-diffusion can be suppressed. The fluorine may be out-diffused into the boron and carbon-doped polysilicon layer 104D" and the boron-doped columnar crystalline polysilicon layer 105D from the boron-doped polysilicon layer 103D which is not doped with carbon, but the out-diffused fluorine may be captured by the carbon 110 of the boron and carbon-doped polysilicon layer 104D". The fluorine captured by the carbon 110 may be piled up in the boron and carbon-doped polysilicon layer 104D", and the piled fluorine may improve the fluorine passivation efficiency in a subsequent process.

After the annealing 131, a stack of the boron-doped polysilicon layer 103D, the boron and carbon-doped polysilicon layer 104D" and the boron-doped columnar crystalline polysilicon layer 105D may be formed on the gate dielectric material 102. The boron-doped polysilicon layer 103D may be doped with the diffused boron 111D, and the boron and carbon-doped polysilicon layer 104D" may be doped with the carbon 110, the first boron 111 and the diffused boron 112D. The boron-doped columnar crystalline polysilicon layer 105D may be doped with the second boron 112.

Subsequently, the boron-doped columnar crystalline polysilicon layer 105D, the boron and carbon-doped polysilicon layer 104D", the boron-doped polysilicon layer 103D and the gate dielectric material 102 may be sequentially etched. Therefore, as illustrated in FIG. 7, the gate structure 300G may be formed.

The gate structure 300G may be a stack of the gate dielectric layer 102G and the gate electrode G4. The gate electrode G4 may have a stacked of including the carbon-undoped gate electrode 301, the carbon-doped gate electrode 302 and the columnar crystalline gate electrode 303. The carbon-doped gate electrode 302 may contain the carbon 110, and the carbon-undoped gate electrode 301 and the columnar crystalline gate electrode 303 may not contain the carbon 110. The carbon-undoped gate electrode 301 may include the diffused first boron 111D, and the boron and carbon-doped gate electrode 302 may include the first boron 111 and the second diffused boron 112D. The columnar crystalline gate electrode 303 may include the second boron 112. The carbon-undoped gate electrode 301, the carbon-doped gate electrode 302 and the columnar crystalline gate electrode 303 may include any suitable passivation species, including, preferably fluorine as passivation species. The carbon-undoped gate electrode 301 may be formed by etching the boron-doped polysilicon layer 103D. The carbon-doped gate electrode 302 may be formed by etching the boron and carbon-doped polysilicon layer 104D". The columnar crystalline gate electrode 303 may be formed by etching the boron-doped columnar crystalline polysilicon layer 105D. The gate dielectric layer 102G may be formed by etching the gate dielectric material 102.

In the above-described embodiment, the first doping process 121 may be performed between the carbon-doped polysilicon layer 104 and the columnar crystalline polysilicon layer 105. The carbon 110 may be contained in the carbon-doped polysilicon layer 104, thereby making it possible to enable uniform doping of boron.

As the first doping process 121 is performed after the carbon-doped polysilicon layer 104 is deposited, the dopant (i.e. boron) concentration of the carbon-doped polysilicon layer 104 may be increased.

When the second doping process 122 is performed, the boron and carbon-doped polysilicon layer 104D may be physically capped by the columnar crystalline polysilicon layer 105, which makes it possible to prevent out-diffusion of the first boron 111.

Since the carbon-undoped polysilicon layer 103 is inserted, damage to the gate dielectric layer 102G can be minimized.

As a result, the present embodiment can improve negative bias temperature instability (NBTI) while improving the polysilicon depletion rate (PDR).

In the embodiment illustrated in FIGS. 8A to 8E, both of the first doping process 121 of the first boron 111 and the second doping process 122 of the second boron 112 may be performed.

In other embodiments of the boron doping process, the second doping process 122 of the second boron 112 may be omitted, and only the first doping process 121 of the first boron 111 may be performed. Furthermore, the first doping process 121 of the first boron 111 may be omitted, and only the second doping process 122 of the second boron 112 may be performed.

Figure 9:
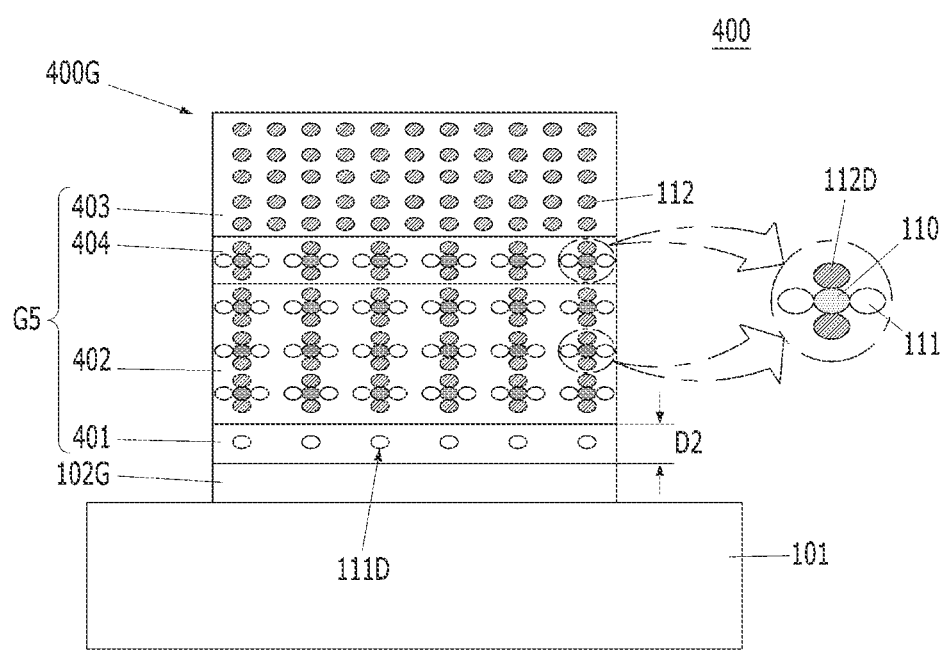
FIG. 9 is a cross-sectional view illustrating a semiconductor device in accordance with an embodiment of the present invention.

FIG. 9 is a cross-sectional view illustrating a semiconductor device in accordance with an embodiment of the present invention.

Referring to FIG. 9, a semiconductor device 400 may include a substrate 101 and a gate structure 400G formed over or, preferably, on the substrate 101. The gate structure 400G may be a stack of a gate dielectric layer 102G and a gate electrode G5. The gate electrode G5 may include a stack of a carbon-undoped gate electrode 401, a carbon-doped gate electrode 402, an interface oxide 404 and a columnar crystalline gate electrode 403. The carbon-undoped gate electrode 401 may directly contact the gate dielectric layer 102G. The substrate 101 and the gate dielectric layer 102G may have the same structures as described with reference to FIG. 1.

The carbon-doped gate electrode 402 may be doped with carbon 110. The carbon-undoped gate electrode 401 and the columnar crystalline gate electrode 403 may not be doped with the carbon 110. The carbon-undoped gate electrode 401, the carbon-doped gate electrode 402 and the columnar crystalline gate electrode 403 may be doped with dopants 111D, 111, 112D and 112, respectively. The dopants 111D, 111, 112D and 112 may include an N-type dopant or P-type dopant. The dopants 111D, 111, 112D and 112 may preferably include boron. The dopants 111D, 111, 112D and 112 may include implanted dopants 111 and 112 and diffused dopants 111D and 112D. The implanted dopants 111 and 112 may indicate dopants implanted by a doping process, and the diffused dopants 111D and 112D may indicate parts of the implanted dopants 111 and 112, which are diffused by annealing. The carbon-doped gate electrode 402 may be doped with the implanted dopant 111, the columnar crystalline gate electrode 403 may be doped with the implanted dopant 112, and the implanted dopants 111 and 112 may be diffused by a subsequent annealing process. The carbon-doped gate electrode 402 and the carbon-undoped gate electrode 401 may include a random polycrystalline polysilicon layer. The columnar crystalline gate electrode 403 may be a columnar crystalline polysilicon layer.

The carbon-doped gate electrode 402 and the carbon-undoped gate electrode 401 may include the diffused dopants 112D and 111D, respectively. The carbon-doped gate electrode 402 and the columnar crystalline gate electrode 403 may include the implanted dopants 111 and 112, respectively. The carbon-doped gate electrode 402 may include the carbon 110, the implanted dopant 111 and the diffused dopant 112D. Since the implanted dopants 111 and 112 and the diffused dopants 111D and 112D contain boron, the carbon-undoped gate electrode 401 and the columnar crystalline gate electrode 403 may be boron-doped polysilicon, and the carbon-doped gate electrode 402 may be carbon and boron-doped polysilicon.

In another embodiment, the columnar crystalline gate electrode 403 may not include the implanted dopant 112. In this case, the carbon-doped gate electrode 402 and the interface oxide 404 may not include the diffused dopant 112D. Therefore, the gate electrode G5 may include the implanted dopant 111 and the diffused dopant 111D, and not include the implanted dopant 112 and the diffused dopant 112D.

In another embodiment, the carbon-doped gate electrode 402 and the interface oxide 404 may include the diffused dopant 112D, but not include the implanted dopant 111. In this case, the carbon-undoped gate electrode 401 may not include the diffused dopant 111D. Therefore, the gate electrode G5 may include the implanted dopant 112 and the diffused dopant 112D, and not include the implanted dopant 111 and the diffused dopant 111D.

The carbon-doped gate electrode 402 and the carbon-undoped gate electrode 401 may further include passivation species. The passivation species may be any suitable passivation species and, preferably, may include fluorine (F). The passivation species may passivate a dangling bond formed at an interface between the gate dielectric layer 102G and the substrate 101. Thus, the reliability of the gate dielectric layer 102G may be improved. The fluorine may be implanted with the implanted dopants 111 and 112, and captured by the carbon 110.

The carbon 110 of the carbon-doped gate electrode 402 may capture the diffused dopant 112D and the implanted dopant 111.

The columnar crystalline gate electrode 403 and the carbon-doped gate electrode 402 may have the same thickness. The carbon-undoped gate electrode 401 may have a smaller thickness than the carbon-doped gate electrode 402. For example, the carbon-undoped gate electrode 401 may preferably have a thickness of 30 Å or less. The carbon-undoped gate electrode 401 may preferably include a disilane-based polysilicon layer. The columnar crystalline gate electrode 403 and the carbon-doped gate electrode 402 may preferably include a monosilane-based polysilicon layer or a disilane-based polysilicon layer.

When each of the columnar crystalline gate electrode 403, the carbon-doped gate electrode 402 and the carbon-undoped gate electrode 401 includes polysilicon, the gate electrode G5 of the semiconductor device 400 may have a triple polysilicon structure.

The implanted dopant 112 may be quickly diffused along the columnar crystalline boundary of the columnar crystalline gate electrode 403. Therefore, the concentration of the diffused dopant 112D of the carbon-doped gate electrode 402 may be maintained at a high concentration.

Since the carbon-doped gate electrode 402 and the carbon-undoped gate electrode 401 have a random polycrystalline structure, the carbon-doped gate electrode 402 and the carbon-undoped gate electrode 401 may suppress the implanted dopant 111 and the diffused dopant 111D from diffusing to the gate dielectric layer 102G. Furthermore, since the carbon 110 of the carbon-doped gate electrode 402 captures the diffused dopant 112D and the implanted dopant 111, the carbon 110 may further suppress the diffused dopant 112D and the implanted dopant 111 from diffusing to the gate dielectric layer 102G.

The gate electrode G5 may further include the interface oxide 404 between the columnar crystalline gate electrode 403 and the carbon-doped gate electrode 402. The interface oxide 404 may contain a dopant. The interface oxide 404 may contain boron. For example, the interface oxide 404 may be boron-doped silicon oxide.

The interface oxide 404 may form a discontinuous interface between the columnar crystalline gate electrode 403 and the carbon-doped gate electrode 402.

The interface oxide 404 may be formed to be ultra-thin. The interface oxide 404 may be oxide obtained by selectively oxidizing the surface of the carbon-doped gate electrode 402. The interface oxide 404 may be thinner than the carbon-undoped gate electrode 401.

When the carbon-doped gate electrode 402 is applied, an oxidation rate is further suppressed than when the carbon-undoped gate electrode 401 is applied. Therefore, the suppressing of the oxidation rate may make it easy to control the interface oxide 404 to an extremely small thickness.

When the interface oxide 404 is thick, the carbon-doped gate electrode 402 and the columnar crystalline gate electrode 403 may be electrically insulated from each other. Thus, the interface oxide 404 needs to be formed ultra-thin. In order to prevent insulation between the carbon-doped gate electrode 402 and the columnar crystalline gate electrode 403, the interface oxide 404 may be doped with boron. The interface oxide 404 doped with boron may reduce resistance.

The interface oxide 404 and the carbon-doped gate electrode 402 may effectively raise controllability over the boron diffusion. By controlling the thickness, the carbon concentration and the carbon concentration profile of the carbon-doped gate electrode 402, it is possible to effectively control boron penetration while improving reliability.

The columnar crystalline gate electrode 403 may include a carbon-undoped polysilicon layer or carbon-doped polysilicon layer. The formation of the columnar crystalline gate electrode 403 may accelerate boron diffusion into the interface oxide 404 and the carbon-doped gate electrode 402. Therefore, the boron concentration of the carbon-doped gate electrode 402 may be increased.

In order to form the interface oxide 404 close to the gate dielectric layer 102G, the carbon-undoped gate electrode 401 may be formed ultra-thin. The ultra-thin carbon-undoped gate electrode 401 may suppress a polysilicon depletion effect and improve reliability.

FIGS. 10A to 10F are cross-sectional views illustrating an example of a method for fabricating the semiconductor device of FIG. 9.

Figure 10A:
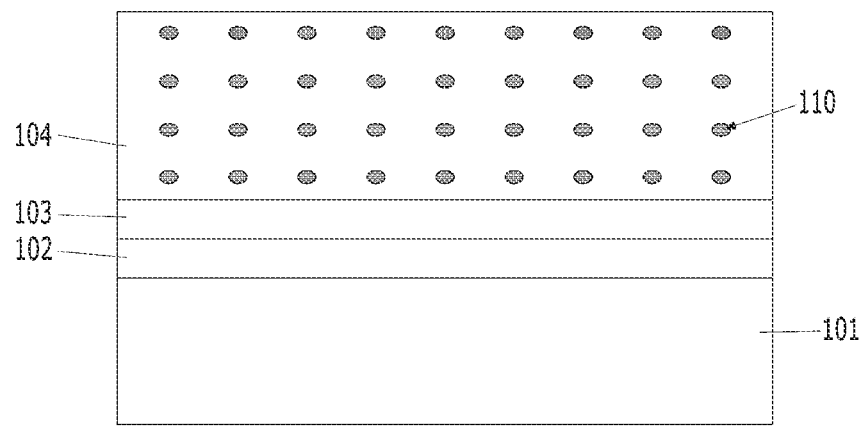
FIGS. 10A to 10F are cross-sectional views illustrating an example of a method for fabricating the semiconductor device of FIG. 9.

As illustrated in FIG. 10A, a gate dielectric material 102 may be formed over the substrate 101. The gate dielectric material 102 may be formed on the substrate 101. A carbon-undoped polysilicon layer 103 may be formed on the gate dielectric material 102. The carbon-undoped polysilicon layer 103 may be in an undoped state where it is not doped with a conductive dopant. The carbon-undoped polysilicon layer 103 may not include carbon. The carbon-undoped polysilicon layer 103 may be formed to be ultra-thin. The carbon-undoped polysilicon layer 103 may be formed of a disilane-based polysilicon layer. The disilane-based polysilicon layer may be formed thinner and more conformally than a monosilane-based polysilicon layer. The disilane-based polysilicon layer can be deposited to a small thickness, preferably of 30 Å or less. Therefore, the carbon-undoped polysilicon layer 103 may have a small thickness, preferably of 30 Å or less.

Then, a carbon-doped polysilicon layer 104 may be formed on the carbon-undoped polysilicon layer 103.

The carbon-undoped polysilicon layer 103 and the carbon-doped polysilicon layer 104 may be formed in-situ. When the carbon-doped polysilicon layer 104 is formed, the carbon 110 may be doped in-situ. When the content of the carbon is too high, the carbon 110 may suppress activation of the conductive dopant during a subsequent activation process. Therefore, the carbon 110 concentration in the carbon-doped polysilicon layer 104 should be controlled below a value which prevents activation of the dopant in a subsequent activation process. For this reason, when boron is dopant, it has been found that the carbon 110 concentration within the carbon-doped polysilicon layer 104 should be preferably $10^{10}$ atoms/cm$^3$ or less. The carbon 110 may be doped in-situ when the carbon-doped polysilicon layer 104 is deposited. For example, when the carbon-doped polysilicon layer 104 is deposited, a silicon source material and a carbon source material may be applied. The carbon 110 may be uniformly distributed within the carbon-doped polysilicon layer 104. The concentration of the carbon 110 may be constant along the thickness of the carbon-doped polysilicon layer 104. Once, the carbon-doped polysilicon layer 103 is formed, the supply of the carbon source material may be stopped in order to form the carbon-undoped layer 104. In another embodiment, the carbon-doped polysilicon layer 104 may be a carbon-graded doped polysilicon layer. For example, the carbon concentration in the carbon-doped polysilicon layer 104 may be graded by gradually changing a flow rate of the carbon source material during the in-situ forming process of the carbon-doped polysilicon layer 104. For example, the carbon concentration could be increased or decreased in a gradual or step wise manner during the in-situ forming process of the carbon-doped polysilicon layer 104 to form the carbon-doped polysilicon layer 104 with a desired carbon concentration profile.

The carbon-undraped polysilicon layer 103 and the carbon-doped polysilicon layer 104 may be deposited, for example, through chemical vapor deposition (CVD) or atomic layer deposition (ALD). The carbon-undoped polysilicon layer 103 may be deposited using a first silicon source material. The carbon-doped polysilicon layer 104 may be deposited using a second silicon source material and a carbon source material.

When the carbon-undoped polysilicon layer 103 is deposited, preferably, disilane ($Si_2H_6$) may be used as the first silicon source material.

When the carbon-doped polysilicon layer 104 is deposited, preferably, monosilane ($Si_2H_4$) or disilane ($Si_2H_6$) may be used as the second silicon source material. A carbon hydrogen compound, for example, $C_2H_4$ may be used as the carbon source material.

The carbon-undoped polysilicon layer 103 may preferably have a smaller thickness than the carbon-doped polysilicon layer 104. For example, the carbon-undoped polysilicon layer 103 may preferably have a thickness of 30 Å or more, and the carbon-doped polysilicon layer 104 may preferably have a thickness of 100 Å or more. In order to increase the thickness of the carbon-doped polysilicon layer 104, monosilane ($SiH_4$) may be preferably used when the carbon-doped polysilicon layer 104 is deposited.

Figure 10B:
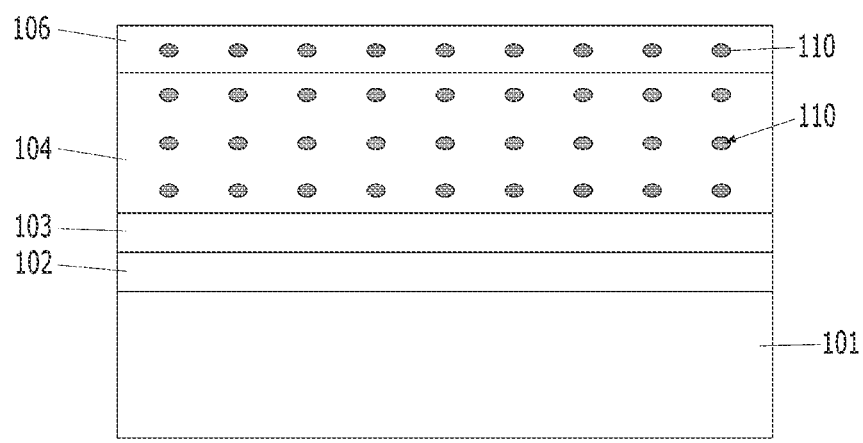

As illustrated in FIG. 10B, an interface oxide material 106 may be formed over and, preferably, on the surface of the carbon-doped polysilicon layer 104. The interface oxide material 106 may be formed after the carbon-doped polysilicon layer 104 is deposited. The interface oxide material 106 may be a surface oxide of the carbon-doped polysilicon layer 104. The interface oxide material 106 may include the carbon 110. The interface oxide material 106 may be formed by oxidizing the surface of the formed carbon-doped polysilicon layer 104. For example, to form the interface oxide material 106, the carbon-doped polysilicon layer 104 may be exposed to an oxygen-containing atmosphere. The interface oxide material 106 may be formed by oxidizing the surface of the formed carbon-doped polysilicon layer 104. For example, to form the interface oxide material 106, at least one of an in-situ steam generation (ISSG) process, ozone oxidation, thermal oxidation, rapid thermal oxidation (RTO) or ozone ($O_3$) cleaning may be used. The interface oxide material 106 may be silicon oxide containing the carbon 110.

The interface oxide material 106 may be formed to be ultra-thin. Preferably, the interface oxide material 106 may be formed to be adequately thin to provide an electrical path between the carbon-doped polysilicon layer 104 and the subsequent columnar crystalline polysilicon layer 105. The interface oxide material 106 may be formed as thin as possible, in order to prevent insulation between the carbon-doped polysilicon layer 104 and a subsequent columnar crystalline polysilicon layer 105. The interface oxide material 106 may have an extremely small thickness corresponding to the native oxide level. The interface oxide material 106 may preferably have a thickness of 10 Å or less, and thus provide an electrical path between the carbon-doped polysilicon layer 104 and the subsequent columnar crystalline polysilicon layer 105.

Figure 10C:
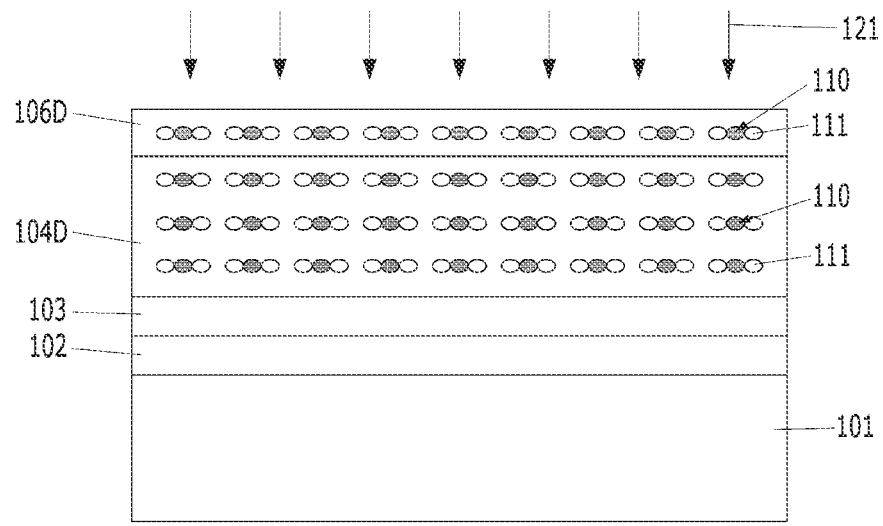

As illustrated in FIG. 10C, once the interface oxide material is formed, then a first doping process 121 may be performed on the interface oxide material 106 and the carbon-doped polysilicon layer 104. The first doping process 121 may be a doping process of an N-type dopant or P-type dopant. For example, a P-type dopant such as first boron 111 may be implanted by the first doping process 121. The first doping process 121 of the first boron 111 may use B, $BF_2$ or $BF_3$ as a boron source. The first doping process 121 of the first boron 111 may include ion beam implantation, plasma doping (PLAD) or a combination thereof.

The first doping process 121 of the first boron 111 may preferably include boron (B) ion beam implantation, $BF_2$ ion beam implantation and/or $BF_3$ plasma doping. The first doping process 121 of the first boron 111 may preferably include boron (B) ion beam implantation and fluorine (F) ion beam implantation which may be performed sequentially. The carbon-doped polysilicon layer 104 may be doped with fluorine by the F ion beam implantation, the $BF_2$ ion beam implantation and/or the $BF_3$ plasma doping. The fluorine serving as passivation species may passivate a dangling bond formed at an interface between the gate dielectric material 102 and the substrate 101 in a subsequent process. The fluorine passivation may improve the reliability of the gate dielectric material 102. The fluorine may be implanted into the carbon-doped polysilicon layer 104 with the first boron 111. The fluorine may be captured by the carbon 110 of the carbon-doped polysilicon layer 104. Thus, out-diffusion of the fluorine can be prevented to improve passivation efficiency.

A boron and carbon-doped polysilicon layer 104D may be formed by the first doping process 121, and the boron and carbon-doped polysilicon layer 104D may indicate the carbon-doped polysilicon layer 104 doped with the first boron 111.

The boron and carbon-doped polysilicon layer 104D may be a doped polysilicon layer which is doped with both of boron and carbon. The first boron 111 may be captured by the carbon 110 and piled-up in the boron and carbon-doped polysilicon layer 104D.

When the first doping process 121 is performed, the interface oxide material 106 may also be doped with the first boron 111. The first boron 111 may be captured by the carbon 110 within the interface oxide material 106. As the interface oxide material 106 is doped with the first boron 111, an interface oxide material 106D may have conductivity. The interface oxide material 106D may provide an electrical path between the carbon-doped polysilicon layer 104D and a subsequent columnar crystalline polysilicon layer 105. The fluorine may also be captured by the carbon 110 of the interface oxide material 106.

The amount of captured first boron 111 may be increased by the boron and carbon-doped polysilicon layer 104D and the interface oxide material 106D.

In another embodiment, plasma doping may be applied as the doping process 121 of the first boron 111 and the fluorine. The plasma doping may be suitable for doping the interface oxide material 106D. When ion beam implantation is applied as the doping process 121 of the first boron 111 and the fluorine, the boron concentration of the carbon-doped polysilicon layer 104D may be raised.

Figure 10D:
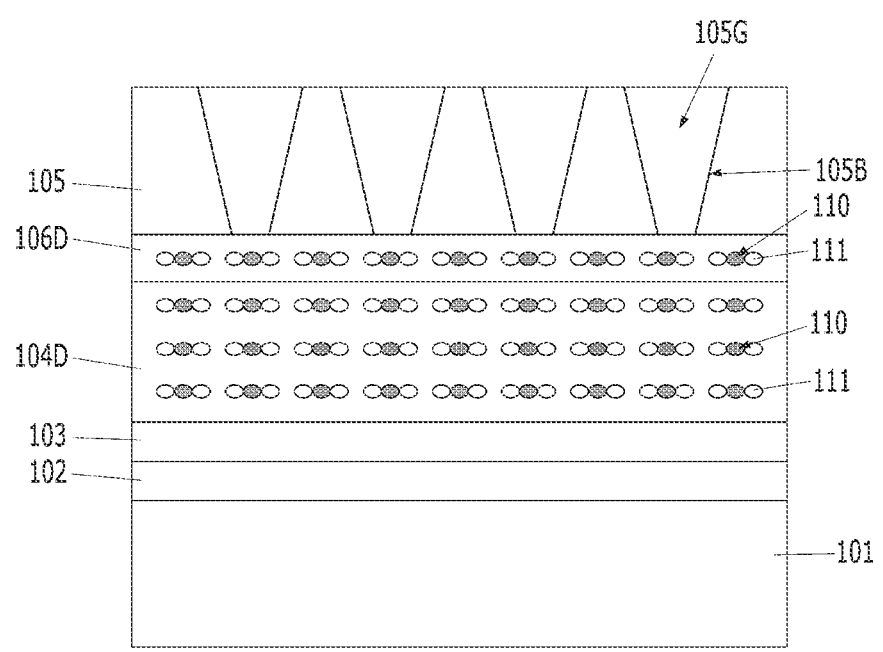

As illustrated in FIG. 10D, the columnar crystalline polysilicon layer 105 may be formed on the interface oxide material 106D. The columnar crystalline polysilicon layer 105 may include columnar grain structures 105G and a crystalline boundary 105B. The columnar crystalline polysilicon layer 105 may have the same thickness as the boron and carbon-doped polysilicon layer 104D and a larger thickness than the carbon-undoped polysilicon layer 103. The columnar crystalline polysilicon layer 105 may be a carbon-undoped columnar crystalline polysilicon layer.

Figure 10E:
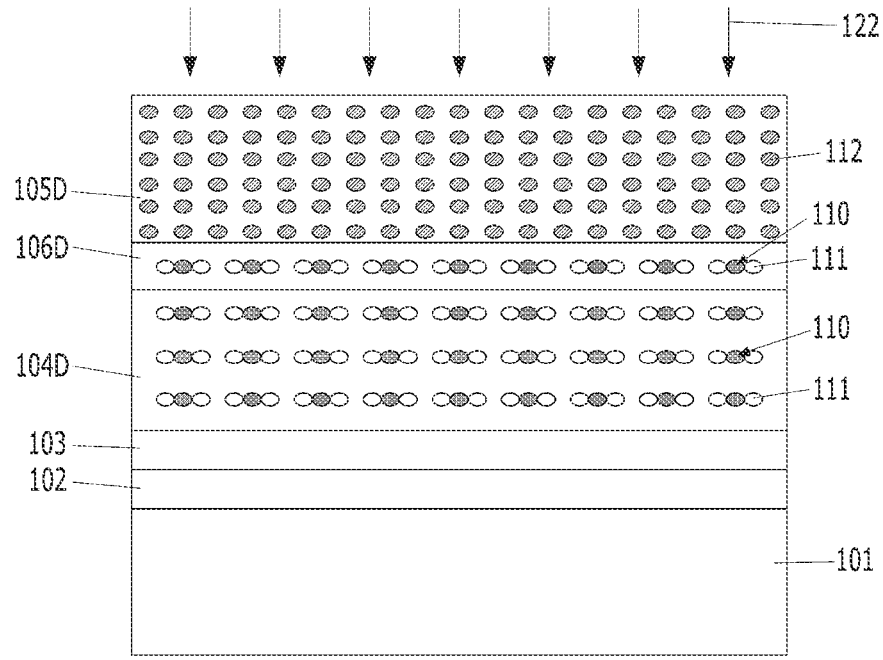

As illustrated in FIG. 10E, a second doping process 122 may be performed on the columnar crystalline polysilicon layer 105. The second doping process 122 may be a doping process of a dopant. For example, a P-type dopant such as second boron 112 may be implanted through the second doping process 122. The second doping process 122 of the second boron 112 may use B, $BF_2$ or $BF_3$ as a boron source. The second doping process 122 of the second boron 112 may include ion beam implantation, plasma doping (PLAD) or a combination thereof. The second doping process 122 of the second boron 112 may be boron (B) ion beam implantation, $BF_2$ ion beam implantation and/or $BF_3$ plasma doping. The second doping process 122 of the second boron 112 may preferably include boron (B) ion beam implantation and fluorine (F) ion beam implantation which may be performed sequentially. The columnar crystalline polysilicon layer 105 may be doped with fluorine as passivation species by the fluorine (F) ion beam implantation, the $BF_2$ ion beam implantation and/or the $BF_3$ plasma doping.

A boron-doped columnar crystalline polysilicon layer 105D may be formed by the second doping process 122. The boron-doped columnar crystalline polysilicon layer 105D may indicate the columnar crystalline polysilicon layer 105 doped with the second boron 112.

In another embodiment, ion beam implantation may be applied as the second doping process 122 of the second boron 112. When the ion beam implantation is applied as the second doping process 122, a projected range Rp may be defined based on the boundary between the interface oxide material 106D and the boron and carbon-doped polysilicon layer 104D.

Figure 10F:
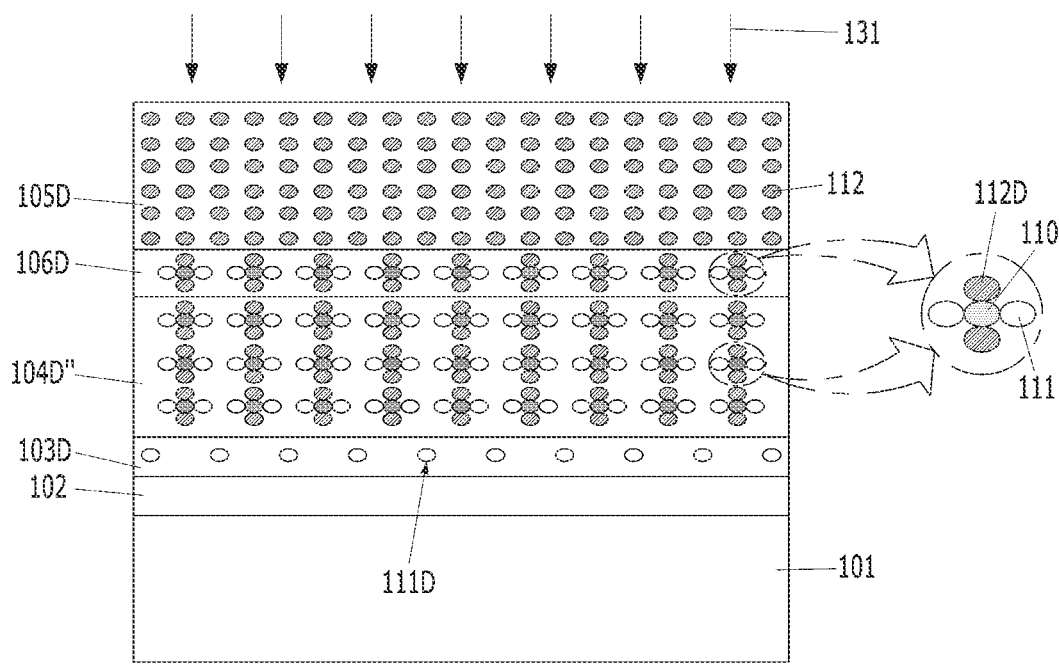

As illustrated in FIG. 10F, annealing 131 may be performed. Dopant diffusion and activation may be performed by the annealing 131. The dopant activation and diffusion may include activation and diffusion of the first boron 111 and the second boron 112.

While the annealing 131 is performed, the second boron 112 may be quickly diffused along the crystalline boundary in the boron-doped columnar crystalline polysilicon layer 105D. Furthermore, the second boron 112 may be diffused into the carbon-doped polysilicon layer 104D from the boron-doped columnar crystalline polysilicon layer 105D. Most of the second boron 112D diffused from the boron-doped columnar crystalline polysilicon layer 105D may be located in the carbon-doped polysilicon layer 104D. The carbon-doped polysilicon layer 104D doped with the diffused second boron 112D may be referred to as 'boron and carbon-doped polysilicon layer 104D"'. The diffused second boron 112D may be captured by the carbon 110 and piled-up in the boron and carbon-doped polysilicon layer 104D". Since the carbon 110 of the boron and carbon-doped polysilicon layer 104D" captures the diffused second boron 112D and the first boron 111, the diffusion of the first boron 111 and the diffused second boron 112D into the carbon-undoped polysilicon layer 103 may be minimized.

While the annealing 131 is performed, diffusion of the second boron 112 and the first boron 111 may continuously occur. However, only a small amount of diffused first boron 111D may be diffused from the boron and carbon-doped polysilicon layer 104D". As the small amount of first boron 111 is diffused, the carbon-undoped polysilicon layer 103 may become the boron-doped polysilicon layer 103D. The boron-doped polysilicon layer 103D may include the diffused first boron 111D. The boron-doped polysilicon layer 103D may not be doped with carbon. The boron concentration of the boron-doped polysilicon layer 103D may be much lower than the boron concentration of the boron and carbon-doped polysilicon layer 104D".

While the annealing 131 is performed, the diffused first boron 111D of the boron-doped polysilicon layer 103D may be diffused to the interface with the gate dielectric material 102, but not penetrate into the gate dielectric material 102.

Although the annealing 131 is performed as described above, most of the first boron 111 and the diffused second boron 112D may not penetrate (preferably substantially none of the first boron 111 and diffused second boron 112D) into the gate dielectric material 102 because most of the first boron 111 and the diffused second boron 112D are captured by the carbon 110. Thus, despite the increased dopant concentration in the polysilicon layer or layers, the gate dielectric material remains free or substantially free of any dopant. Therefore, a polysilicon depletion rate (PDR) can be improved.

While the annealing 131 is performed, fluorine may be piled up in the boron and carbon-doped polysilicon layer 104D" and the interface oxide material 106D. The interface oxide material 106D may capture the fluorine out-diffused from the boron and carbon-doped polysilicon layer 104D".

The out-diffusion of the fluorine may be prevented by the carbon 110 of the boron and carbon-doped polysilicon layer 104D". The out-diffusion of the fluorine may indicate the phenomenon that the fluorine is desorbed to the outside of the boron and carbon-doped polysilicon layer 104D". Since the fluorine is captured by the carbon 110, out-diffusion may be suppressed. The fluorine may be out-diffused into the boron and carbon-doped polysilicon layer 104D" and the boron-doped columnar crystalline polysilicon layer 105D from the boron-doped polysilicon layer 103D which is not doped with carbon, but the out-diffused fluorine may be captured by the carbon 110 of the boron and carbon-doped polysilicon layer 104D". Furthermore, the fluorine out-diffused from the boron and carbon-doped polysilicon layer 104D" may be captured by the carbon 110 of the interface oxide material 106D.

The fluorine captured by the carbon 110 may be piled up in the boron and carbon-doped polysilicon layer 104D and the interface oxide material 106D, and improve the fluorine passivation efficiency in a subsequent process.

After the annealing 131, a stack of the boron-doped polysilicon layer 103D, the boron and carbon-doped polysilicon layer 104D", the interface oxide material 106D and the boron-doped columnar crystalline polysilicon layer 105D may be formed on the gate dielectric material 102. The boron-doped polysilicon layer 103D may be doped with the diffused boron 111D. The interface oxide material 106D and the boron and carbon-doped polysilicon layer 104D may be doped with the carbon 110, the first boron 111 and the diffused boron 112D. The boron-doped columnar crystalline polysilicon layer 105D may be doped with the second boron 112.

Subsequently, the boron-doped columnar crystalline polysilicon layer 105D, the interface oxide material 106D, the boron and carbon-doped polysilicon layer 104D", the boron-doped polysilicon layer 103D and the gate dielectric material 102 may be sequentially etched. Therefore, as illustrated in FIG. 9, the gate structure 400G may be formed.

The gate structure 400G may be a stack of the gate dielectric layer 102G and the gate electrode G5. The gate electrode G5 may have a stacked structure of the carbon-undoped gate electrode 401, the carbon-doped gate electrode 402, the interface oxide 404 and the columnar crystalline gate electrode 403. The carbon-doped gate electrode 402 and the interface oxide 404 may contain the carbon 110, and the carbon-undoped gate electrode 401 and the columnar crystalline gate electrode 403 may not contain the carbon 110. The carbon-undoped gate electrode 401 may include the diffused first boron 111D, and the boron and carbon-doped gate electrode 402 and the interface oxide 404 may include the first boron 111 and the second diffused boron 112D. The columnar crystalline gate electrode 403 may include the second boron 112. The carbon-undoped gate electrode 401, the carbon-doped gate electrode 402 and the columnar crystalline gate electrode 403 may include fluorine. The carbon-undoped gate electrode 401 may be formed by etching the boron-doped polysilicon layer 103D. The carbon-doped gate electrode 402 may be formed by etching the boron and carbon-doped polysilicon layer 104D". The interface oxide 404 may be formed by etching the interface oxide material 106D. The columnar crystalline gate electrode 403 may be formed by etching the boron-doped columnar crystalline polysilicon layer 105D. The gate dielectric layer 102G may be formed by etching the gate dielectric material 102.

In the above-described embodiment, the first doping process 121 may be performed before the columnar crystalline polysilicon layer 105 is deposited. The carbon 110 may be contained in the carbon-doped polysilicon layer 104, thereby making it possible to enable uniform doping of boron.

Since the first doping process 121 is performed after the carbon-doped polysilicon layer 104 is deposited and the interface oxide material 106 is formed, the dopant (i.e. boron) concentration of the carbon-doped polysilicon layer 104D may be increased.

When the second doping process 122 is performed, the boron and carbon-doped polysilicon layer 104D and the interface oxide material 106D may be physically capped by the columnar crystalline polysilicon layer 105, which makes it possible to prevent out-diffusion of the first boron 111.

Since the carbon-undoped polysilicon layer 103 is inserted, damage to the gate dielectric layer 102G may be minimized.

As a result, the present embodiment can improve NBTI while improving the polysilicon depletion rate PDR.

In the above-described embodiments, the columnar crystalline polysilicon layer 105 may be formed. In another embodiment, however, a random polycrystalline polysilicon layer, a carbon-doped polysilicon layer or a carbon-undoped polysilicon layer other than the columnar crystalline polysilicon layer 105 may be formed.

In the embodiment illustrated in FIGS. 10A to 10F, both of the first doping process 121 of the first boron 111 and the second doping process 122 of the second boron 112 may be performed.

In other embodiments of the boron doping process, the second doping process 122 of the second boron 112 may be omitted, and only the first doping process 121 of the first boron 111 may be performed. Furthermore, the first doping process 121 of the first boron 111 may be omitted, and only the second doping process 122 of the second boron 112 may be performed.

By selectively performing the first doping process 121 of the first boron 111 and the second doping process 122 of the second boron 112, it is possible to easily adjust the boron concentrations of the carbon-doped gate electrode 402, the interface oxide 404 and the columnar crystalline gate electrode 403.

Figure 11:
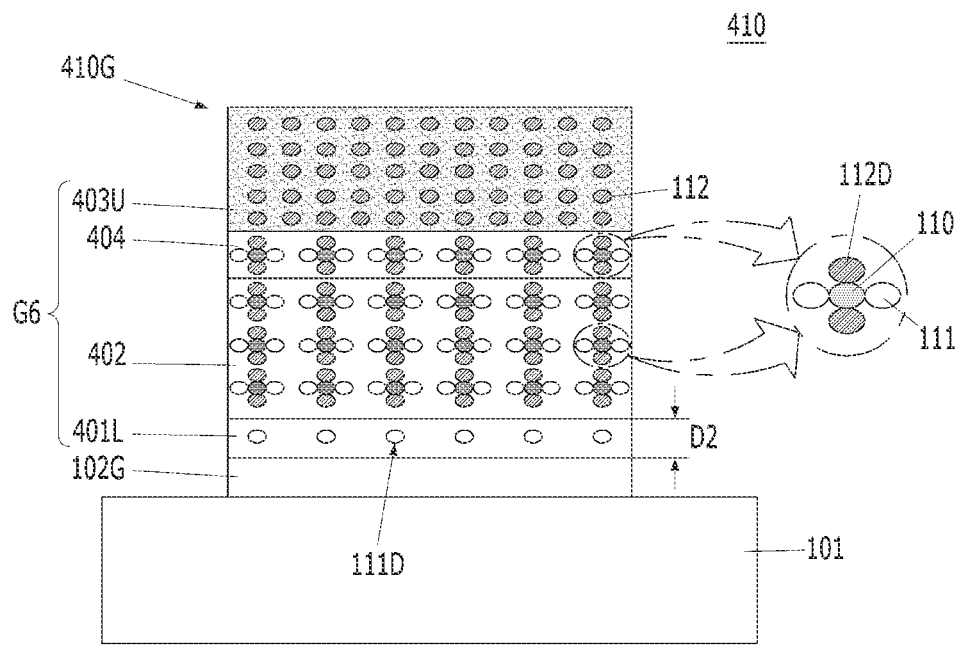
FIG. 11 is a cross-sectional view illustrating a semiconductor device in accordance with an embodiment of the present invention.

FIG. 11 is a cross-sectional view illustrating a semiconductor device in accordance with an embodiment of the present invention. A semiconductor device 410 illustrated in FIG. 11 may be similar to the semiconductor device 400 of FIG. 9.

Referring to FIG. 11, the semiconductor device 410 may include a substrate 101 and a gate structure 410G formed over or, preferably, on the substrate 101. The gate structure 410G may be a stack of a gate dielectric layer 102G and a gate electrode G6. The gate electrode G6 may include a stack of a first carbon-undoped gate electrode 401L, a carbon-doped gate electrode 402, an interface oxide 404 and a second carbon-undoped gate electrode 403U. The first carbon-undoped gate electrode 401L may directly contact the gate dielectric layer 102G. The first carbon-undoped gate electrode 401L may be the same as the carbon-undoped gate electrode 401 of FIG. 9. The first carbon-undoped gate electrode 401L may preferably include a disilane-based polysilicon layer. The carbon-doped gate electrode 402 and the interface oxide 404 may be the same as the carbon-doped gate electrode 402 and the interface oxide 404 of FIG. 9.

The second carbon-undoped gate electrode 403U may be a random polycrystalline polysilicon layer. The second carbon-undoped gate electrode 403U may preferably be a monosilane-based polysilicon layer or disilane-based polysilicon layer.

The first carbon-undoped gate electrode 401L may include a diffused dopant 111D. The carbon-doped gate electrode 402 may include carbon 110, an implanted dopant 111 and a diffused dopant 112D. The second carbon-undoped gate electrode 403U may include an implanted dopant 112. The implanted dopants 111 and 112 and the diffused dopants 111D and 112D may preferably include boron.

In another embodiment, the second carbon-undoped gate electrode 403U may not include the implanted dopant 112. In this case, the carbon-doped gate electrode 402 and the interface oxide 404 may not include the diffused dopant 112D. Therefore, the gate electrode G6 may include the implanted dopant 111 and the diffused dopant 111D, and not include the implanted dopant 112 and the diffused dopant 112D.

In another embodiment, the carbon-doped gate electrode 402 and the interface oxide 404 may include the diffused dopant 112D, but not include the implanted dopant 111. In this case, the carbon-undoped gate electrode 401 may not include the diffused dopant 111D. Therefore, the gate electrode G6 may include the implanted dopant 112 and the diffused dopant 112D, and not include the implanted dopant 111 and the diffused dopant 111D.

The first carbon-undoped gate electrode 401L, the carbon-doped gate electrode 402, the interface oxide 404 and the second carbon-undoped gate electrode 403U may include any suitable passivation species, including, preferably fluorine as passivation species. The fluorine may be captured by the carbon 110 of the carbon-doped gate electrode 402 and the interface oxide 404.

In another embodiment, the second carbon-undoped gate electrode 403U may not include the implanted dopant 112, and the carbon-doped gate electrode 402 may not include the diffused dopant 112D.

The method for fabricating the semiconductor device 410 of FIG. 11 may be similar to the method illustrated in FIGS. 10A to 10E.

Figure 12A:
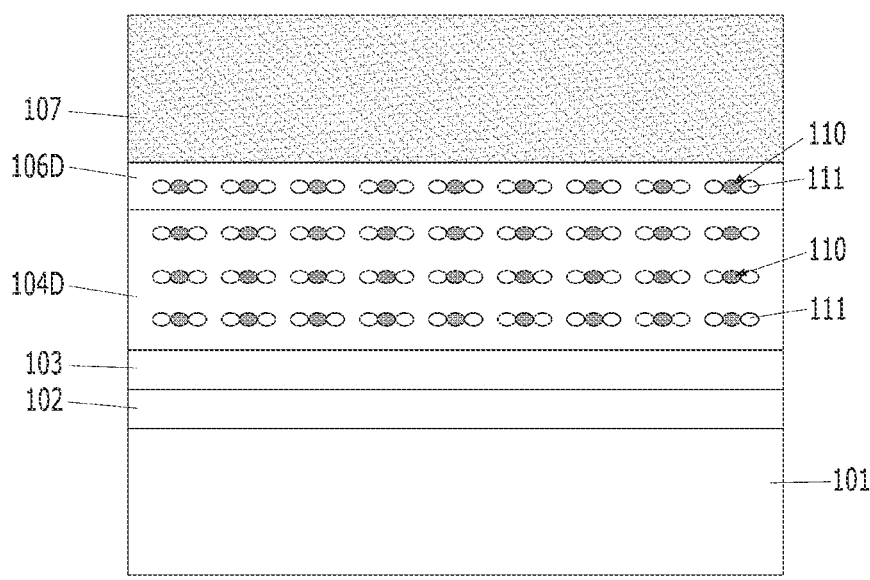
FIGS. 12A to 12C are cross-sectional views illustrating an example of a method for fabricating the semiconductor device of FIG. 11.
Figure 12B:
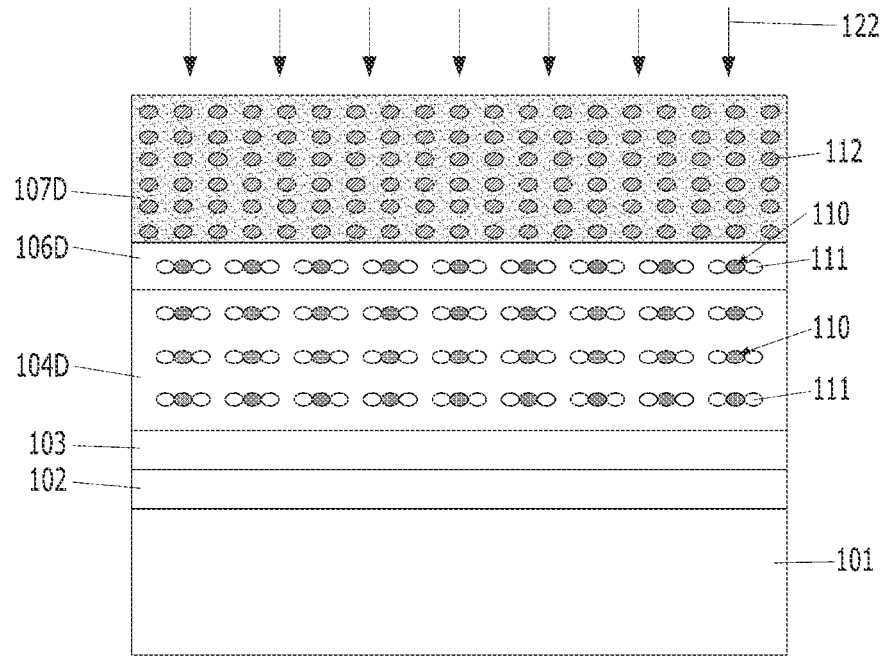
Figure 12C:
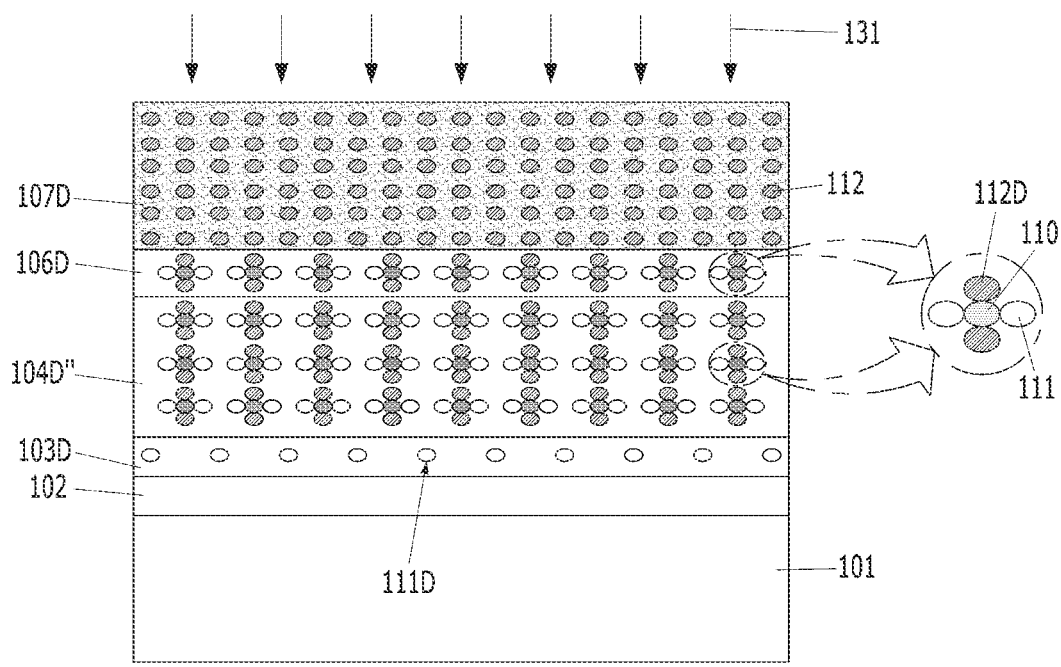

FIGS. 12A to 12C are cross-sectional views illustrating an example of a method for fabricating the semiconductor device 410 of FIG. 11.

Through the series of processes illustrated in FIG. 10A, a gate dielectric material 102, a carbon-undoped polysilicon layer 103 and a carbon-doped polysilicon layer 104 may be sequentially formed over the substrate 101. The carbon-undoped polysilicon layer 103 may be formed of a disilane-based polysilicon layer, and the carbon-doped polysilicon layer 104 may be formed of a disilane-based polysilicon layer or a monosilane-based polysilicon layer. In order to increase the thickness of the carbon-doped polysilicon layer 104, the carbon-doped polysilicon layer 104 may be formed of a monosilane-based polysilicon layer.

As illustrated in FIG. 10B, the interface oxide material 106 may be formed over and preferably on the surface of the carbon-doped polysilicon layer 104.

The interface oxide material 106 may be formed after the carbon-doped polysilicon layer 104 is deposited. The interface oxide material 106 may be a surface oxide of the carbon-doped polysilicon layer 104. The interface oxide material 106 may include the carbon 110. The interface oxide material 106 may be formed by oxidizing the surface of the formed carbon-doped polysilicon layer 104. For example, to form the interface oxide material 106, the carbon-undoped polysilicon layer 104 may be exposed to an oxygen-containing atmosphere. The interface oxide material 106 may be formed by oxidizing the surface of the formed carbon-doped polysilicon layer 104. For example, to form the interface oxide material 106, an ISSG process, ozone oxidation, thermal oxidation, RTO or $O_3$ cleaning may be used. The interface oxide material 106 may be silicon oxide containing the carbon 110.

The interface oxide material 106 may be formed to be ultra-thin. Preferably, the interface oxide material 106 may be formed to be adequately thin to provide an electrical path between the carbon-doped polysilicon layer 104 and the subsequent columnar crystalline polysilicon layer 105. The interface oxide material 106 may be formed as thin as possible, in order to prevent insulation between the carbon-doped polysilicon layer 104 and a subsequent carbon-undoped polysilicon layer 107. The interface oxide material 106 may preferably have a thickness of 10 Å or less, and thus provide an electrical path between the carbon-doped polysilicon layer 104 and the subsequent carbon-undoped polysilicon layer 107.

As illustrated in FIG. 10C, once the interface oxide material is formed, then the first doping process 121 of the first boron 111 may be performed. The interface oxide material 106 and the carbon-doped polysilicon layer 104 may be doped with the first boron 111. During the first doping process 121 of the first boron 111, fluorine may be implanted together with the first boron 111. The first doping process 121 may include doping the interface oxide material 106 and the carbon-doped polysilicon layer 104 with an N-type dopant other than the first boron 111.

Then, as illustrated in FIG. 12A, the carbon-undoped polysilicon layer 107 may be formed on the interface oxide material 106D. The carbon-undoped polysilicon layer 107 may include a random polycrystalline polysilicon layer. The carbon-undoped polysilicon layer 107 may have a larger thickness than the carbon-undoped polysilicon layer 103. The carbon-undoped polysilicon layer 107 may be formed of a monosilane-based polysilicon layer.

In another embodiment, the carbon-undoped polysilicon layer 107 may be formed of a carbon-doped polysilicon layer.

As illustrated in FIG. 12B, the second doping process 122 of the second boron 112 may be performed. The second doping process 122 of the second boron 112 may include ion beam implantation, plasma doping (PLAD) or a combination thereof. The second doping process 122 of the second boron 112 may be boron (B) ion beam implantation, $BF_2$ ion beam implantation or $BF_3$ plasma doping. The second doping process 122 of the second boron 112 may preferably include boron (B) ion beam implantation and fluorine (F) ion beam implantation which may be performed sequentially. The carbon-undoped polysilicon layer 107 may be doped, preferably, with fluorine by the fluorine (F) ion beam implantation, the $BF_2$ ion beam implantation and/or the $BF_3$ plasma doping.

The carbon-undoped polysilicon layer 107 doped with the second boron 112 through the second doping process 122 may become a boron-doped polysilicon layer 107D.

As illustrated in FIG. 12C, annealing 131 may be performed. The first boron 111 and the second boron 112 may be diffused and activated by the annealing 131.

Diffusion of the second boron 112 may indicate that the second boron 112 is uniformly diffused in the boron-doped polysilicon layer 107D. Furthermore, diffusion of the second boron 112 may indicate that the second boron 112 is diffused into the boron and carbon-doped polysilicon layer 104D from the boron-doped polysilicon layer 105D. Most of the second boron 112D diffused from the boron-doped polysilicon layer 105D may be located in the boron and carbon-doped polysilicon layer 104D. The boron and carbon-doped polysilicon layer 104D" doped with the diffused second boron 112D may include the diffused second boron 112D, the first boron 111 and the carbon 110. The diffused second boron 112D and the first boron 111 may be captured by the carbon 110 and piled-up in the boron and carbon-doped polysilicon layer 104D".

While the annealing 131 is performed, diffusion of the second boron 112 and the first boron 111 may continuously occur. Therefore, the carbon-undraped polysilicon layer 103 may become the boron-doped polysilicon layer 103D. The boron-doped polysilicon layer 103D may include the diffused first boron 111D. The boron-doped polysilicon layer 103D may not be doped with carbon. The boron concentration of the boron-doped polysilicon layer 103D may be lower than the boron concentration of the boron and carbon-doped polysilicon layer 104D".

While the annealing 131 is performed, the diffused first boron 111D of the boron-doped polysilicon layer 103D may be diffused to the interface with the gate dielectric material 102, but not penetrate into the gate dielectric material 102.

While the annealing 131 is performed, fluorine may be captured by the carbon 110 of the boron and carbon-doped polysilicon layer 104D" and the interface oxide material 106.

Although the annealing 131 is performed as described above, most of the first boron 111 and the diffused second boron 112D may not penetrate (preferably substantially none of the first boron 111 and the diffused second boron 112D) into the gate dielectric material 102 because most of the first boron 111 and the diffused second boron 112D are captured by the carbon 110. Therefore, a polysilicon depletion rate (PDR) can be improved.

After the annealing 131, a stack of the boron-doped polysilicon layer 103D, the boron and carbon-doped polysilicon layer 104D", the interface oxide material 106D and the boron-doped polysilicon layer 107D may be formed on the gate dielectric material 102. The boron-doped polysilicon layer 103D may be doped with the diffused boron 111D, and the boron and carbon-doped polysilicon layer 104D" may be doped with the carbon 110, the first boron 111 and the diffused boron 112D. The boron-doped polysilicon layer 107D may be doped with the second boron 112.

Subsequently, the boron-doped polysilicon layer 107D, the interface oxide material 106D, the boron and carbon-doped polysilicon layer 104D", the boron-doped polysilicon layer 103D and the gate dielectric material 102 may be sequentially etched. Therefore, as illustrated in FIG. 11, the gate structure 410G may be formed.

The gate structure 410G may be a stack of the gate dielectric layer 102G and the gate electrode G6. The gate electrode G6 may have a stacked structure of the first carbon-undoped gate electrode 401L, the carbon-doped gate electrode 402, the interface oxide 404 and the second carbon-undoped gate electrode 403U. The carbon-doped gate electrode 402 and the interface oxide 404 may contain the carbon 110, and the first carbon-undoped gate electrode 401L and the second carbon-undoped gate electrode 403U may not contain the carbon 110. The first carbon-undoped gate electrode 401L. may include the diffused first boron 111D, and the boron and carbon-doped gate electrode 402 and the interface oxide 404 may include the first boron 111 and the second diffused boron 112D. The second carbon-undoped gate electrode 403U may include the second boron 112. The carbon-doped gate electrode 402 and the interface oxide 404 may further include fluorine. The first carbon-undoped gate electrode 401L may be formed by etching the boron-doped polysilicon layer 103D. The carbon-doped gate electrode 402 may be formed by etching the boron and carbon-doped polysilicon layer 104D". The interface oxide 404 may be formed by etching the interface oxide material 106D. The second carbon-undoped gate electrode 403U may be formed by etching the boron-doped polysilicon layer 107D. The gate dielectric layer 102G may be formed by etching the gate dielectric material 102.

In the embodiment illustrated in FIGS. 12A to 12C, both of the first doping process 121 of the first boron 111 and the second doping process 122 of the second boron 112 may be performed.

In other embodiments of the boron doping process, the second doping process 122 of the second boron 112 may be omitted, and only the first doping process 121 of the first boron 111 may be performed, Furthermore, the first doping process 121 of the first boron 111 may be omitted, and only the second doping process 122 of the second boron 112 may be performed.

By selectively performing the first doping process 121 of the first boron 111 and the second doping process 122 of the second boron 112, it is possible to easily adjust the boron concentrations of the carbon-doped gate electrode 402, the interface oxide 404 and the second carbon-undoped gate electrode 403U.

In the above-described embodiments, fluorine may be captured by the carbon 110, and diffused by thermal of subsequent processes (for example, a source/drain formation process, an interlayer dielectric layer formation process and the like). For example, the fluorine may be diffused to the interface between the gate dielectric layer 102G and the substrate 101 by the thermal of the subsequent processes, thereby removing a dangling bond. The carbon 110 and the interface oxide 404 may prevent out-diffusion of the fluorine by the thermal of the subsequent processes.

In a comparative example, when the carbon 110 or/and the interface oxide 404 are not present, the fluorine may be out-diffused to the outside of the gate electrodes G1 to G6 by thermal of the subsequent processes, thereby degrading passivation efficiency.

In the present embodiments, however, out-diffusion of the fluorine may be prevented by the carbon 110 or/and the interface oxide 404, even though the thermal of the subsequent processes is applied. Therefore, the passivation efficiency can be improved.

The gate structures 100G, 120G, 200G, 300G and 400G in accordance with the above-described embodiments may be applied to a gate structure of a PMOSFET. Furthermore, the gate structures 100G, 120G, 200G, 300G and 400G may be applied to a gate structure of a PMOSFET of a CMOSFET.

In other embodiments, the gate structures 100G, 120G, 200G, 300G and 400G may be applied to a gate structure of an NMOSFET.

The carbon-undoped gate electrodes 100U', 100U, 201, 301 and 401, the carbon-doped gate electrodes 100D', 100D, 202, 302 and 402, the interface oxide 404, the columnar crystalline gate electrodes 203, 303 and 403, the first carbon-undoped gate electrode 401L and the second carbon-undoped gate electrode 403U may include an N-type dopant such as phosphorous (P) or arsenic (As), and further include fluorine as passivation species. The doping process of the N-type dopant may include ion beam implantation, plasma doping (PLAD) or a combination thereof. The fluorine may be implanted by fluorine ion beam implant.

Figure 13:
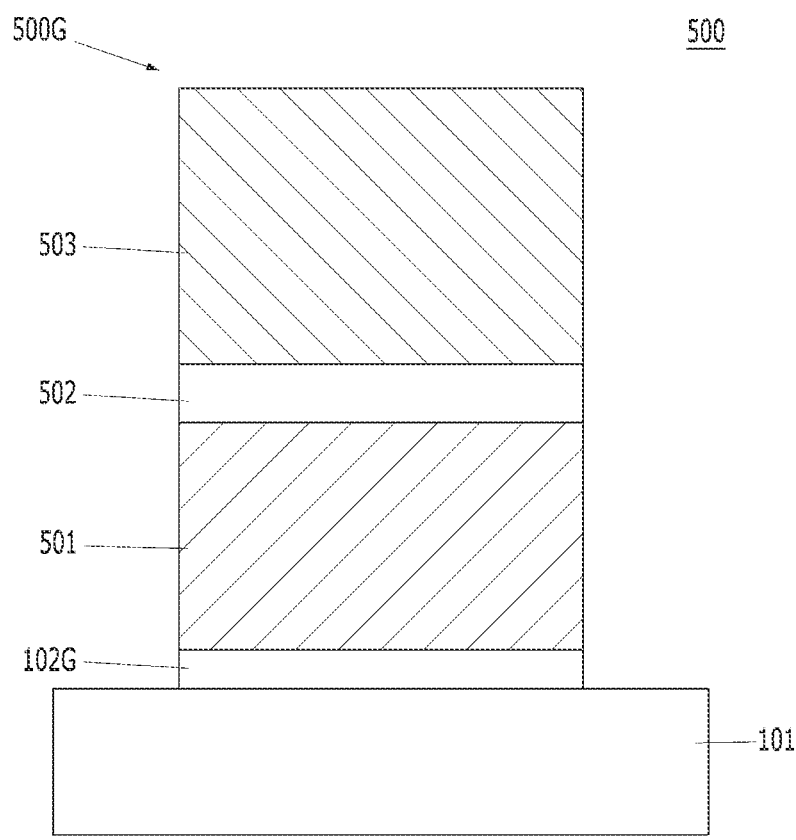
FIG. 13 is a cross-sectional view illustrating a semiconductor device in accordance with an embodiment of the present invention.

FIG. 13 is a cross-sectional view illustrating a semiconductor device in accordance with an embodiment of the present invention.

Referring to FIG. 13, a semiconductor device 500 may include a substrate 101 and a gate structure 100G formed over or, preferably, on the substrate 101. The gate structure 500G may be a stack of a gate dielectric layer 102G, a polysilicon gate electrode 501, a barrier metal 502 and a metal gate electrode 503. The polysilicon gate electrode 501 may be any one of the gate electrodes G1 to G6 in accordance with the above-described embodiments. The barrier metal 502 may for example include metal nitride such as titanium nitride. The metal gate electrode 503 may include any suitable metal such as, for example, tungsten.

In accordance with the present embodiments, the forming of the interface oxide and the dopant doping may be performed to increase the concentration of the dopant captured by the carbon.

The carbon-doped polysilicon layer and the interface oxide can prevent the dopant from penetrating into the gate dielectric layer.

Since the columnar crystalline polysilicon caps the carbon-doped polysilicon layer, out-diffusion of the dopant implanted into the carbon-doped polysilicon layer can be prevented.

The carbon-undoped polysilicon layer can minimize the damage to the gate dielectric layer.

Furthermore, it is possible to improve the electrical characteristics of the gate dielectric layer while improving the polysilicon depletion rate (PDR).

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a gate dielectric layer over a substrate; and
a gate electrode over the gate dielectric layer,
wherein the gate electrode comprises:
a carbon-undoped polys con layer over the gate dielectric layer;
a carbon-doped polysilicon layer over the carbon-undoped polysilicon layer;
a columnar crystalline polysilicon layer over the carbon-doped polysilicon layer; and
a conductive interface oxide formed between the carbon-doped polysilicon layer and the columnar crystalline polysilicon layer.

2. The semiconductor device of claim 1, wherein each of the carbon-undoped polysilicon layer, the carbon-doped polysilicon layer, the columnar crystalline polysilicon layer and the conductive interface oxide include boron as a dopant.

3. The semiconductor device of claim 1, wherein the carbon-undoped polysilicon layer includes a disilane-based polysilicon layer.

4. The semiconductor device of claim 1, wherein the conductive interface oxide includes oxide of the carbon-doped polysilicon layer.

5. The semiconductor device of claim 1, wherein the conductive interface oxide includes boron-doped silicon oxide.

6. The semiconductor device of claim 1, wherein the conductive interface oxide includes boron and carbon-doped silicon oxide.

7. The semiconductor device of claim 1, wherein the carbon-undoped polysilicon layer has a smaller thickness than the carbon-doped polysilicon layer.

* * * * *